(12) United States Patent
Ralstin

(10) Patent No.: US 9,320,356 B2
(45) Date of Patent: Apr. 26, 2016

(54) TAMPER-RESISTANT AND EASY-ACCESS UTILITY PEDESTAL

(71) Applicant: Mark E. Ralstin, Boise, ID (US)

(72) Inventor: Mark E. Ralstin, Boise, ID (US)

(*) Notice: Subject to any disclaimer, the term of this patent is extended or adjusted under 35 U.S.C. 154(b) by 144 days.

(21) Appl. No.: 14/300,226

(22) Filed: Jun. 9, 2014

(65) Prior Publication Data

US 2014/0362502 A1 Dec. 11, 2014

Related U.S. Application Data

(60) Provisional application No. 61/832,436, filed on Jun. 7, 2013.

(51) Int. Cl.
*H02G 9/00* (2006.01)
*A47B 81/00* (2006.01)
*H05K 5/02* (2006.01)

(52) U.S. Cl.
CPC .............. *A47B 81/00* (2013.01); *H05K 5/0208* (2013.01)

(58) Field of Classification Search
CPC . H05K 5/0234; H05K 5/0208; H05K 5/0239; H05K 5/0217; H05K 5/0221; H02B 1/50; A47B 51/00; H02G 9/00
USPC ........... 174/50, 37–39, 535; 361/600, 679.01, 361/641, 659, 601, 602; 312/100; 52/3; 220/484
See application file for complete search history.

(56) References Cited

U.S. PATENT DOCUMENTS

| | | | |
|---|---|---|---|
| 3,906,295 A | 9/1975 | Tessmer | |
| 4,005,253 A | 1/1977 | Walter | |
| 4,133,021 A | 1/1979 | King et al. | |
| 4,135,375 A * | 1/1979 | Voegeli | E05B 67/38 220/210 |
| 5,384,427 A | 1/1995 | Volk et al. | |
| 5,801,632 A | 9/1998 | Opal | |

(Continued)

FOREIGN PATENT DOCUMENTS

WO 01/20739 A1 3/2001

OTHER PUBLICATIONS

Single Meter Service Pedestal, Cal Trans Type III-BF, Pacific Utility Products, http://www.pedestals.net/ProductsDetails.php?recordID=49, May 7, 2013.

(Continued)

*Primary Examiner* — Angel R Estrada
*Assistant Examiner* — Dimary Lopez Cruz
(74) *Attorney, Agent, or Firm* — Pedersen and Company, PLLC; Ken J. Pedersen; Barbara S. Pedersen

(57) ABSTRACT

A protective device for housing utility equipment is tamper-resistant and allows easy access to the equipment for maintenance. A slidable mounting unit is normally stored and operative inside the durable main body in an in-use position, but may be lifted up, with the utility equipment attached, from the main body for access to the equipment. The mounting unit is locked inside the main body by a lock that is difficult to access with any cutting or impact tools, to prevent or limit vandalism and opening of the system. The lock may be located in a space beneath the mounting unit and accessible through multiple small and narrow hand-holes that tend to allow only a person's hands, with a key or key-card, to reach the lock. A pivotal antenna/mast system may be included in a way that allows only an authorized user to lower the antenna/mast for maintenance.

17 Claims, 19 Drawing Sheets

(56) References Cited

U.S. PATENT DOCUMENTS

| | | | | |
|---|---|---|---|---|
| 5,860,715 | A * | 1/1999 | Lohde | H02B 1/50 |
| | | | | 174/50 |
| 6,712,086 | B1 | 3/2004 | Fails | |
| 7,333,320 | B2 * | 2/2008 | Standish | G02B 6/4451 |
| | | | | 174/37 |
| 7,361,832 | B2 | 4/2008 | Dively | |
| 7,971,742 | B2 * | 7/2011 | Kreider | E03B 7/075 |
| | | | | 220/23.89 |
| 9,022,439 | B2 * | 5/2015 | Ousley | H02G 9/10 |
| | | | | 174/50 |

OTHER PUBLICATIONS

Pedestals, http://www.snyderplasticsolutionsutility.com/above_grade_pedestals.php, May 7, 2013, pp. 1-8.

Utility Locating Devices, http://www.rodoncorp.com/utility/2.1.utilitymarker.php, May 7, 2013, pp. 1-2.

Traffic & Lighting Division—Service Pedestals & Utility Metering, http://www.tescocontrols.com/traffic-and-lighting-division/service-pedestals-and-utility-metering, May 7, 2013.

* cited by examiner

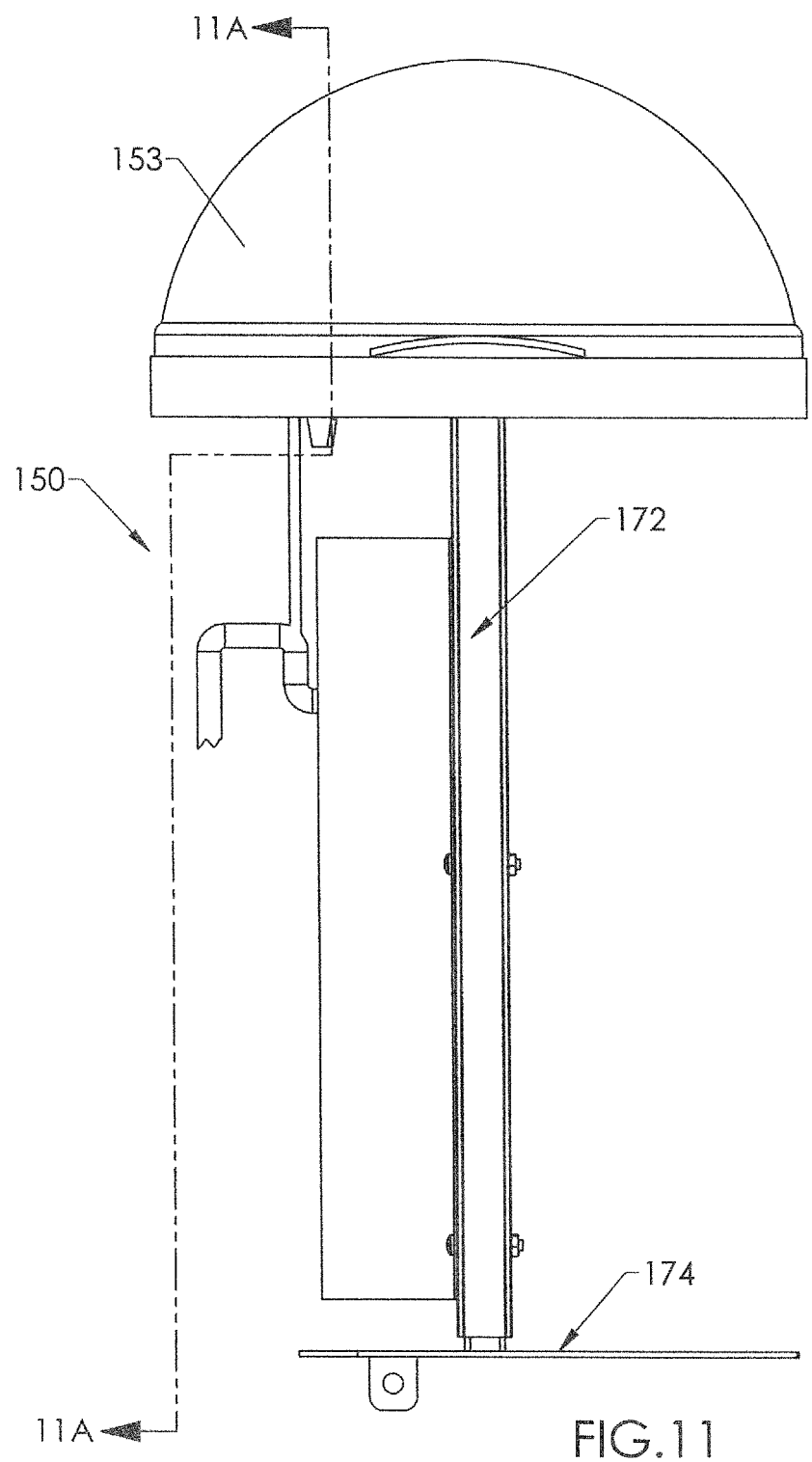

TAMPER-RESISTANT AND EASY-ACCESS UTILITY PEDESTAL

This application claims benefit of U.S. Provisional Application Ser. No. 61/832,436, filed Jun. 7, 2013, the entire disclosure of which is incorporated herein by this reference.

BACKGROUND OF THE DISCLOSED TECHNOLOGY

1. Field of the Disclosed Technology

The disclosed device relates generally to utility pedestals, for example, enclosures for housing various pieces of utility equipment such as computers, controllers, data-loggers, batteries, sensors, and/or transmitters and receivers. The disclosed device may house, for example, equipment for control and/or monitoring of irrigation, power generation, power supply, lighting, alarms, traffic control, environmental testing, or other utilities or services. More specifically, the disclosed utility pedestal comprises adaptations for tamper- and vandalism-resistance, and for improved access to the housed utility equipment during maintenance, data- or sample-retrieval, and/or equipment switch-out.

2. Related Art

Many devices conventionally called "utility pedestals" are used in commerce and utility services, and many are portrayed in the patent literature. These utility pedestals, however, are typically box-like "cabinets", containing the utility equipment and having a door at a side of the cabinet. The door is typically locked by a lock that is exposed at the outside of the cabinet and therefore visible and accessible to vandals.

To access the equipment inside a conventional utility pedestal, an authorized technician unlocks the easily-accessible lock, opens the door, and reaches into the interior of the cabinet to try to reach and service the equipment therein. Typically, the technician must bend over or even kneel, in order to be at a level where he/she can reach into the cabinet. This conventional utility pedestal technology may be summarized as easy to vandalize and damage, and yet difficult to maintain and repair because the equipment contained therein is so difficult to reach and to see.

SUMMARY

The invention comprises a containment and protection device for housing various pieces of utility equipment and/or associated wiring or wireless elements. The device comprises a tamper-resistant or tamper-proof housing having an interior space with a mounting system for holding one or more of said various pieces of utility equipment/elements. Certain embodiments of the device comprise an access system whereby an authorized user may open the housing and extend the utility equipment out from the housing for convenient access when maintenance, testing, data- or sample-retrieval or other contact with the utility equipment is needed. The device may comprise a tamper-resistant or tamper-proof housing lock, which is difficult or impossible to reach with a lock-cutting or -breaking tool such as those typically used by vandals. One or more receiving and/or transmitting antenna(s) may be provided, wherein the mounting or housing elements for the antenna(s) may comprise adaptations for improving access to, and/or protection of, the antennas.

Objects of the disclosed technology, therefore, comprise provision of a device that is easy to use, in terms of both installation and maintenance of the utility equipment/elements housed in the device. Objects of the disclosed technology also comprise the device being significantly more tamper- and damage-resistant than conventional utility pedestals, so that the device is unaffected or at least little affected by vandals' or criminals' attempts to break-into, steal, or damage the device or its contents. For example, the housing is preferably adapted to resist the lock being cut or broken, the lid/door being pried-open, and the housing body being dented, cut, shot, or broken. The device will frequently be outdoors in remote locations, and, therefore, the device is preferably resistant to small-arms fire. Larger-caliber bullets may cause a dent or hole in the device, in certain embodiments, but the preferred mounting unit system is specially-adapted to allow lifting and lowering of the equipment/elements, and/or to allow other access by the authorized user, in spite of such dents or holes.

The device may be used to receive and house hardware, firmware, software, antennas, receivers, transmitters, electrical wiring, electrical connections/outlets, and/or equipment for control, sampling, sensing, monitoring, and/or data-logging, for example. The device may be installed on public or private land, outdoors or in or near buildings, on docks, along roadways, or in any location wherein a protective and preferably weather-resistant and tamper-resistant enclosure is needed for utility equipment.

The device may operatively connect and cooperate with, or control, adjacent or other "local" equipment. For example, a wired or wireless connection from the utility equipment in the disclosed device may be used to monitor and/or control adjacent/local irrigation, lighting, traffic signals, parking gates, payment/toll systems, alarms, public announcements, and/or other display or sound systems.

Alternatively, the device may be autonomous, in that it does not connect and cooperate with, or control, adjacent/local equipment. For example, a self-contained environmental sensing and monitoring station, for example, may be an autonomous device that gathers and transmits information from its environment and either logs/stores it for occasional retrieval by a technician, or transmits it (wired or wirelessly) to the a remote computer, lab, control station, or the internet.

These and/or other objects, adaptations, elements, or functions may be included in the device and/or methods of using the device. The attached drawings and the description below illustrate some, but not necessarily all, embodiments of the disclosed apparatus and methods. Additional embodiments may be apparent to those of average skill in the art after viewing this disclosure, and said additional embodiments are included as embodiments of the invented apparatus and methods.

BRIEF DESCRIPTION OF THE DRAWINGS

FIG. 11 is a side view of the mounting unit of FIG. 9 (with exemplary equipment/wires/cables).

DETAILED DESCRIPTION

Figure 1:
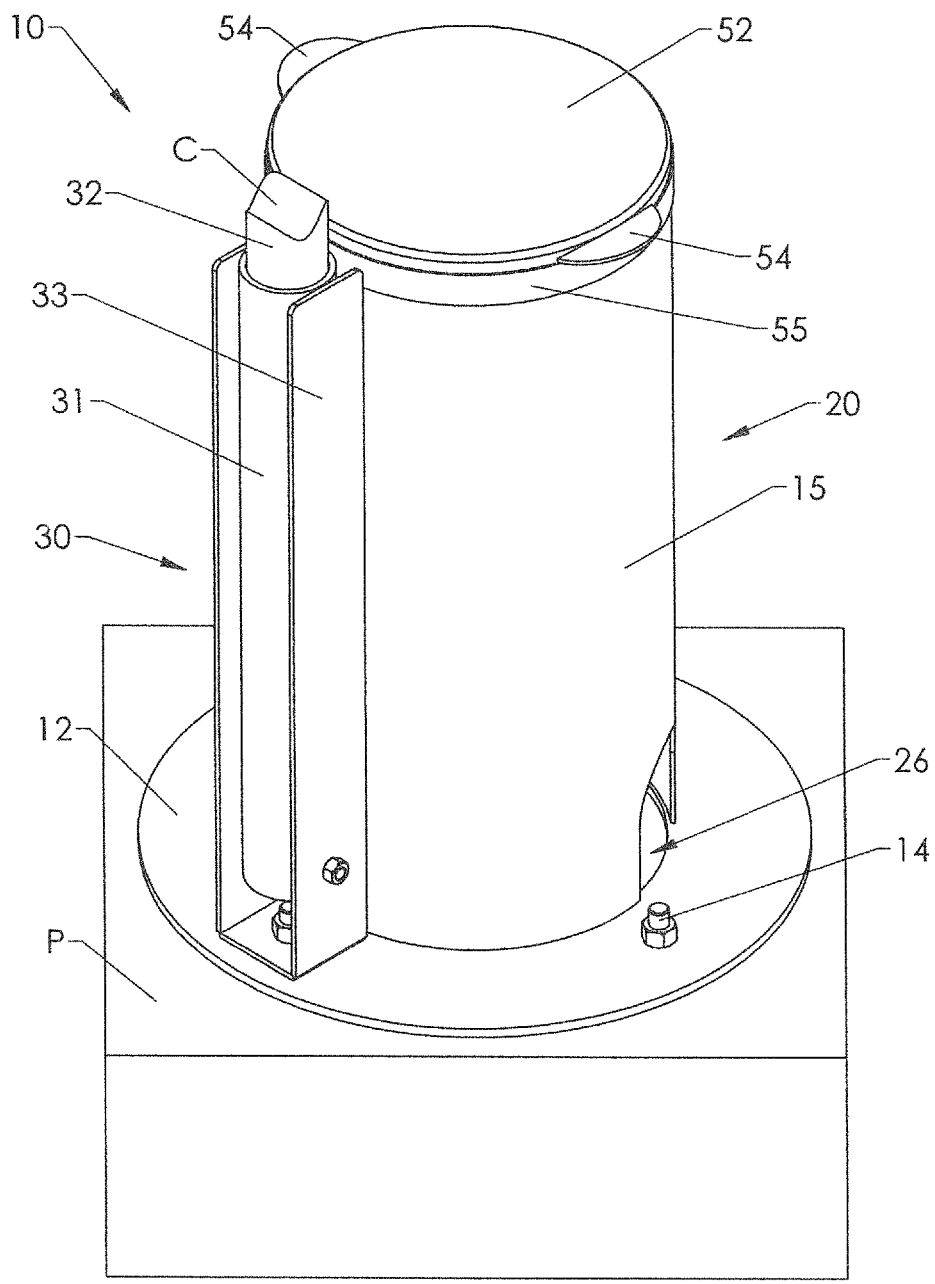
FIG. 1 is an isometric side view of one embodiments of the device being used as a utility pedestal on a concrete pad and including a pivotal antenna or mast.

Referring to the Figures, there are shown several, but not the only, embodiments of the invented device. The device may be used outdoors or indoors. Many embodiments will be used outdoors, for example, along roadways or waterways, in parks, forests, or on other public or private land, beside buildings, in parking lots, in courtyards, or along driveways. Some embodiments may be used indoors, for example, in utility rooms, garages, sheds, warehouses, stores, workshops, or factories.

The figures show examples of utility equipment that may be mounted and housed in the disclosed device, but many other pieces of utility equipment and/or associated wiring, cables, antenna(s), and/or other elements may be installed in the device. While no peripheral equipment, such as cooperating, monitored, and/or controlled adjacent or local equipment is shown in the drawings, it will understood that the equipment that the device houses may be operatively connected to said adjacent or local equipment. Also, while no remote equipment, such as lab, control station, internet, or computer equipment, is shown, it will be understood that the equipment that the device houses may be operatively connected to said remote equipment. Said adjacent/local equipment and/or remote equipment may be adapted for many different "utilities", for example but not limited to, irrigation, traffic control, parking control, environmental sensing and testing, public announcement or information display, power generation or supply, lighting, alarms, Wi-FI, cellular telephone, security or safety services, camera or video services, or other traditional or non-traditional utilities/services.

Certain embodiments of the device will be on the order of 1.5-4 feet tall, more preferably about 2 feet tall, excluding any platform or support on which the device is installed. Certain embodiments will be 1-2 feet in diameter. Such dimensions are well-suited for mounting of most pieces of utility equipment that need shelter and protection in a utility pedestal. Such dimensions will allow most technicians to stand next to the device and/or on its platform/support and to lift the mounting unit and the utility equipment it holds. In other words, certain embodiments rely on a technician manually lifting the mounting unit of the device upward out of, or substantially out of, the main body of the device. The preferred mounting unit and the equipment housed inside the device, therefore, are preferably of such dimensions and weight that the technician may lift the mounting unit with its attached utility equipment and then rotate it to latch it in the service position. Alternatively or in addition, for example in certain embodiments wherein the outer housing of the device is likely to become dented, adaptations may be included that allow an authorized user to access the housed equipment/elements even in the event that the mounting system is raiseable only a small distance due to said dents.

Less preferably, a mechanized/motorized lifting means may be added in some embodiments, for example, in larger embodiments and/or heavier embodiments. Also, less preferably, stairs, ladder, and/or scaffolding may be used by the technician to reach the upper end of the larger units, in which case, a lifting mechanism may be beneficial because of the size or weight of the mounting unit and its mounted equipment.

FIGS. 1-4A illustrate one embodiment of the disclosed device, a utility pedestal device 10, in its closed, in-use configuration wherein the utility equipment is sheltered and protected within the device 10. FIGS. 1-3B show the device 10 secured to a permanent or otherwise difficult-to-move structure, for example, by a bottom plate 12 of the main body 20 of the device being secured to a concrete pad/platform P. The bottom plate 12 of the device 10 is bolted down, by bolts 14, to the concrete platform P, so that the main body 20 upends generally vertically from the platform P. The bolts 14 are welded, locked, or otherwise made difficult or impossible to remove by conventional tools carried by vandals. The bottom plate 12 may be ⅜ inch thick steel or other metal or other durable materials, for example, and may be welded to the upending main body sidewall 15. The sidewall 15 is preferably a smooth, cylindrical wall, without protrusions, hooks, or loops that would allow a vandal to gain leverage against portions of the main body. The sidewall 15 is preferably 10 gauge steel pipe, other metal(s), or other material(s) that is/are rigid, strong, and durable, resulting in the main body being resistant to bullets, hammers, crow-bars, large animals (such as cattle on the range), and other impacts and tools. One may note that a bar might be inserted into one or both of the apertures 26 near the bottom of the sidewall, but the sidewall 15 is of such material and strength, for example, 10-gauge steel pipe, that little or no damage may be done by such attempted vandalism. An additional shell, sleeve, or other cover may be added to cover the main body and/or the apertures 26, for further protection against damage and break-in, for example, to make the device 10 even more fully bulletproof. Such an additional cover will preferably be locked in place until an authorized user removes or moves the additional cover. Also, it may be desirable to cover/coat the device with indicia, such as trademarks, ownership labels, or warnings, and/or with decoration, such as camouflage or other markings to help it blend into the environment or even stand out from the environment.

Figure 3:
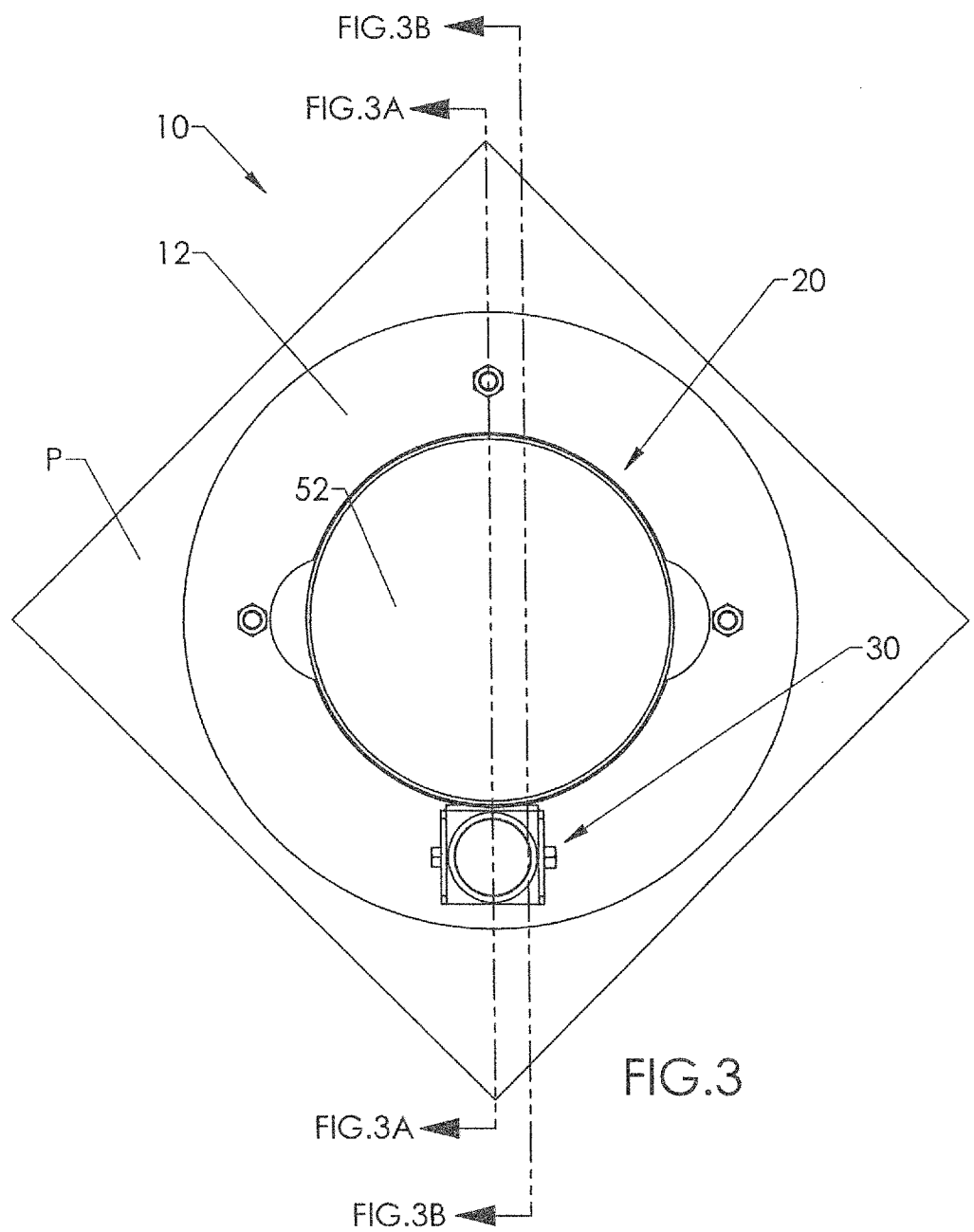
FIG. 3 is a top view of the embodiment of FIG. 1.
Figure 3A:
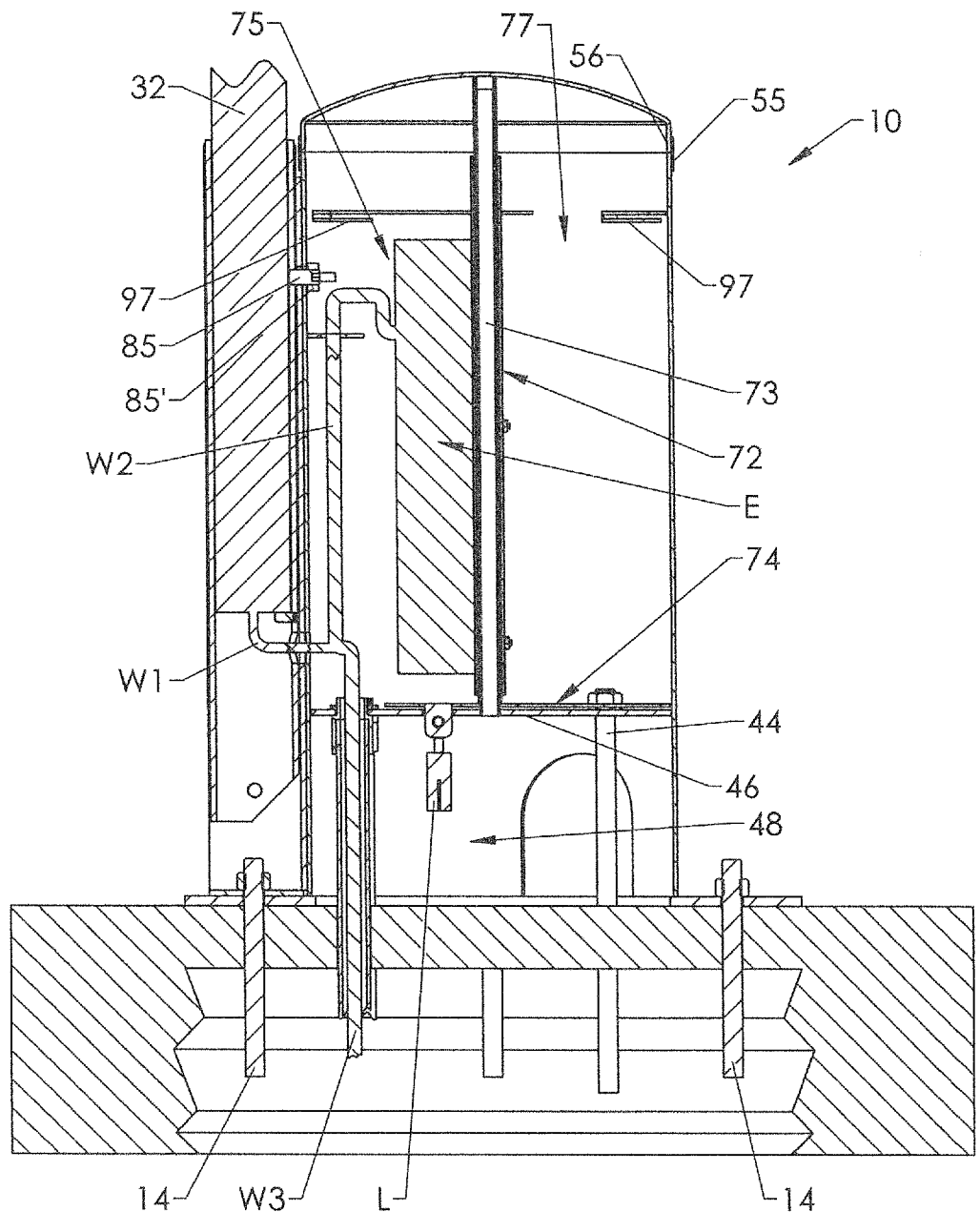
FIG. 3A is a cross-sectional side view of the embodiment of FIG. 1, viewed along the line 3A-3A in FIG. 3, wherein exemplary utility equipment and wires/cables are shown as an example of equipment that may be mounted and housed in the device.

FIGS. 3A and B illustrate to best advantage how the device is secured to a stationary pad/platform internally as well as externally. One may see an interior bolt 44 extending through the floor 46 of the main body that separates the lower, lock space 48 from the upper, equipment space 49. The interior bolt 44 extends through the lock space 48 into the concrete platform P.

The interior of the device is generally divided into a lock space and an equipment space. Generally horizontal floor 46 is rigidly and immovably secured to the sidewall, and serves in many embodiments to separate the lock space 48 from the equipment space 49, to anchor interior bolt(s) 44, and to provide the slot for the tab-and-slot locking system for lock L.

The lock space 48 may be broadly described as the lower portion of the main body interior volume that is surrounded and defined at its sides or radial perimeter by the sidewall 15 (or a skirt/bottom-cover), at its bottom by the upper surface of the platform P and/or a bottom wall of the device, and at its top by generally horizontal floor 46. In certain embodiments, the lock space 48 is about the lower ⅜-⅓ of the interior volume, and the equipment space 49 is preferably the upper ⅔-⅝ (and more preferably about ¾) of the interior volume.

The equipment space 49 may be broadly described as an upper portion of the main body interior volume that is surrounded and defined at its sides or radial perimeter by the sidewall 15, at its bottom by horizontal floor 46, and at its top by a lid. Optionally, the equipment space may be divided into multiple compartments, for example, by moving the horizontal frame portion (74) of the mounting unit 50 up higher in the interior volume to provide a lower equipment space below the horizontal frame portion (to hold batteries or other equipment that is heavy and/or less likely to require lifting up from the main body, for example) and to provide an upper equipment space above the horizontal frame portion (for equipment more likely to require lifting for access during data retrieval, maintenance, or replacement). See FIGS. 12-14, for example.

Figure 3B:
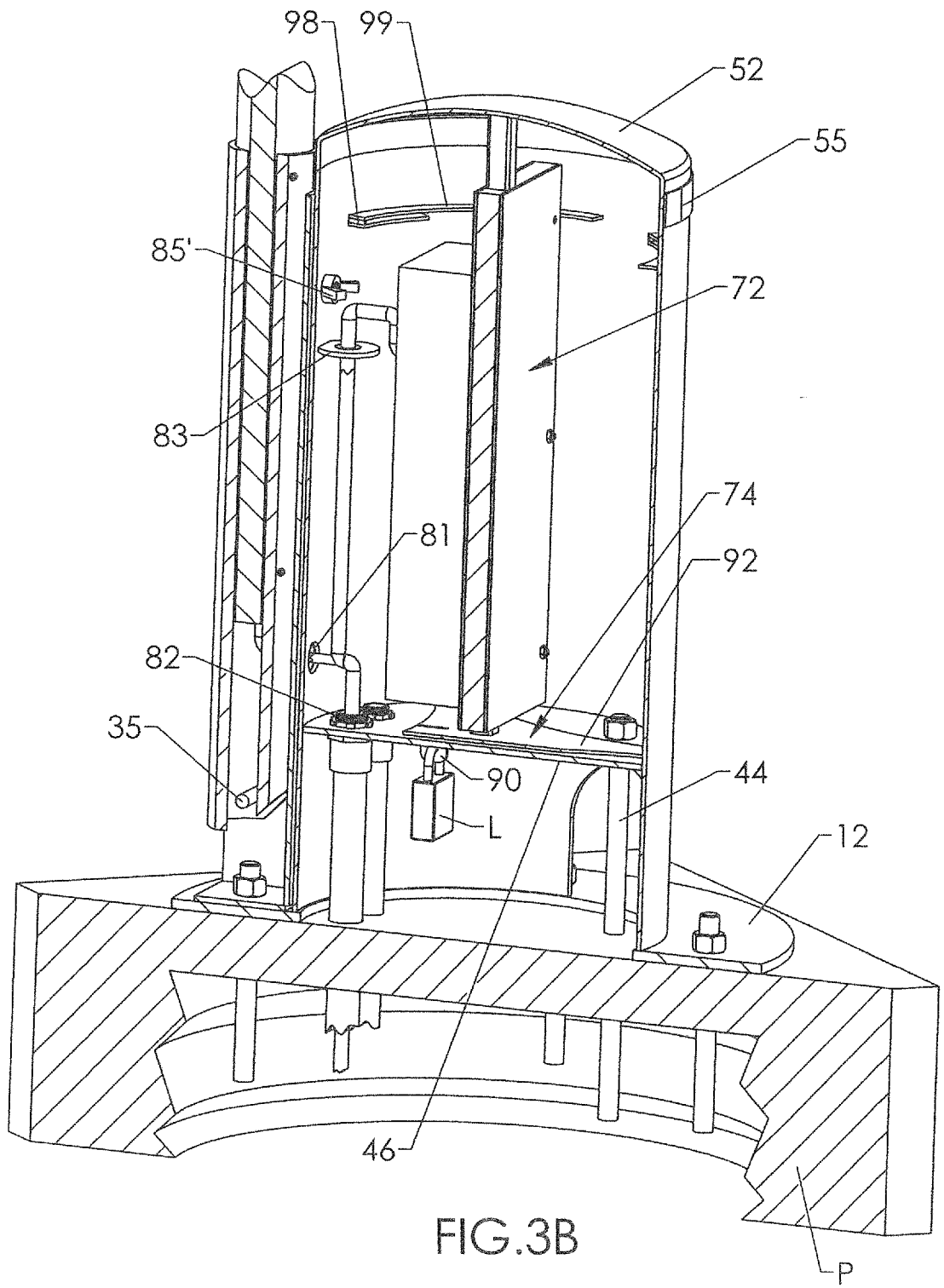
FIG. 3B is a cross-sectional, isometric, side view of the embodiment of FIG. 1, viewed along the line 3B-3B in FIG. 3, wherein said exemplary equipment and wires/cables are again shown.

Thus, as best shown in FIG. 3B, both external and internal fasteners, such as bolts, secure the device 10 to the platform P. For example, in certain embodiments, at least one exterior bolt (14) or other fastener secures a bottom plate 12 or other exterior flange/member to the platform P and at least one interior bolt (44) or other fastener connects secures interior structure of the device 10 to the platform P. In the preferred embodiment, interior bolt 44 passes through the floor 46 of the main body and into the platform P, thus securing the floor 46 to the platform P by means that is entirely or substantially hidden and inaccessible by a vandal. Thus, even if a vandal could dislodge/loosen the exterior bolt(s)/fastener(s), the interior bolt(s)/fastener(s) is/are provided as an additional security measure to further thwart the vandal.

Connected to the outside of the main body sidewall 15 is a holder 30 for an antenna or a solar panel mast. The holder 30 provides a pivotal connection of an antenna/mast 32 to the main body 20. The lower portion of an antenna/mast 32 is shown installed in the receiver tube 31 of the holder 30, and the upper end is cut off at C for convenience in drawing. The antenna/mast 32 is retained in the tube 31 by retaining structure that is permanent, or optionally only accessible and unlatchable/unlockable when the tube 31 is lowered; for example, multiple set screws 34 extend through the tube to engage the rear side of the antenna/mast, as visible in FIG. 2. Additionally, a limit post 36 at the rear of the tube 31 and antenna/mast 32 extends underneath the bottom end of the antenna/mast 32 to prevent it from falling or being pushed down against the wires/cables W1.

The tube 31 is pivotally connected to a channel guard 33 near the bottom of the tube 31, so that the tube, and hence the antenna/mast, may pivot about 90 degrees from a vertical or generally vertical position to a horizontal or generally horizontal position near the ground (FIG. 2) whereby a technician (or "user") may reach even the top of the antenna/mast for maintenance of the antenna, solar panel, or other equipment at or near the top of the mast from the ground level. The tube 31 is held in the upright position until a latch accessible only by an authorized user is unlatched and the tube and antenna/mast are lowered toward the ground. For example, the tube 31 may be secured to the main body 20 by a latch at or near the top of the tube 31 that is unlatchable only from interior equipment space 49 of the main body. A threaded latch (85, 85') is shown in FIGS. 3A and 3B, but other latches may be used. Therefore, by preventing unauthorized access to the interior of the main body of the device 10, unauthorized access to the latch (85, 85') and the antenna/mast retainer removal elements (34) is also prevented. Only after the main lock L of the device is unlocked, can a person lower the antenna/mast 32 for maintenance, including removing the set screws 34 if desired.

Figure 5:
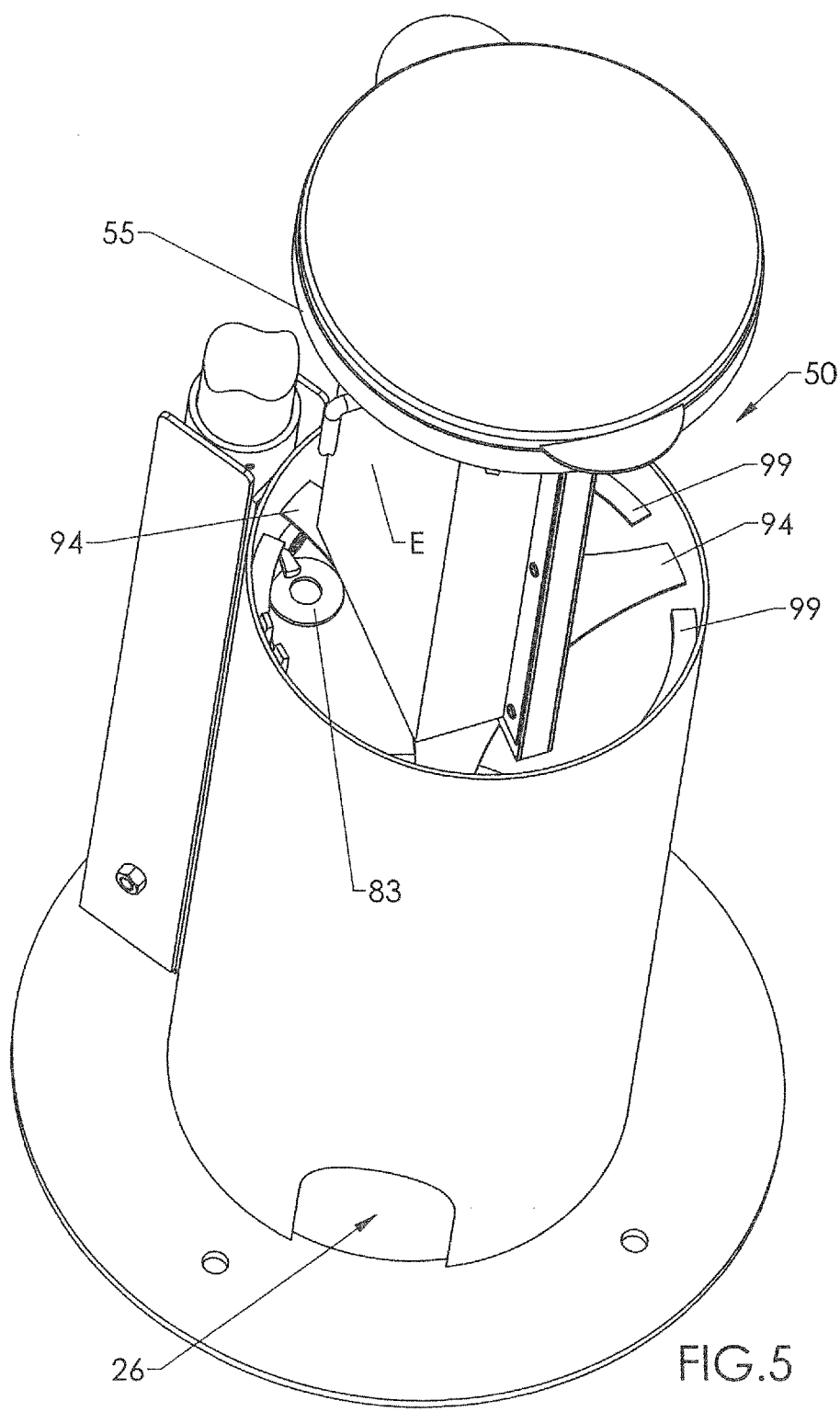
FIG. 5 is an isometric top view of the embodiment of FIG. 1, removed from the concrete pad, and shown with the mounting unit of the device being lifted up to a raised or "extended" service position for exposure of, and access to, the exemplary equipment/wiring/cables mounted on or connected to the mounting unit. The pivotal antenna/mast is shown in its upright position.
Figure 6:
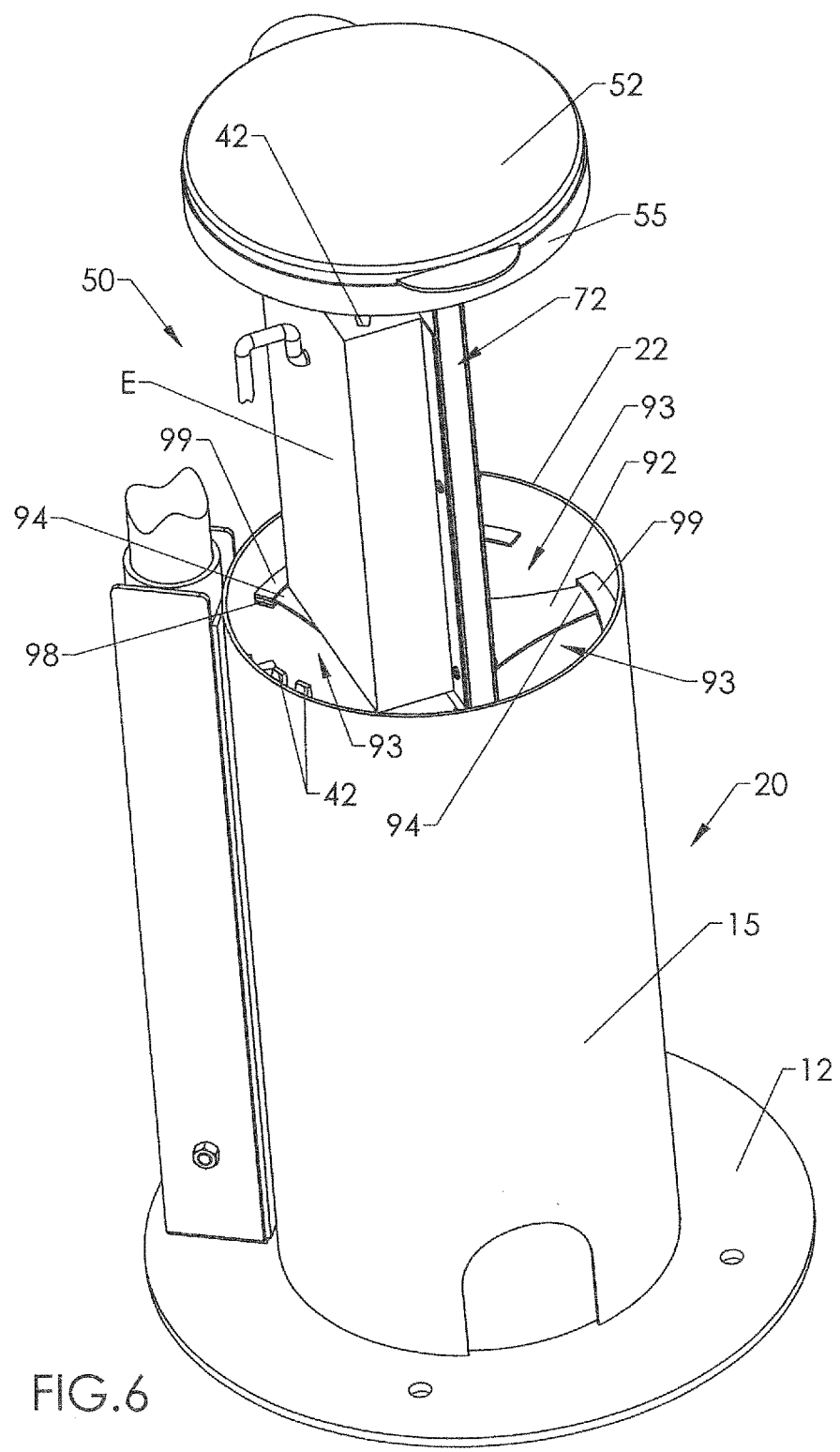
FIG. 6 is an isometric side view of the embodiment of FIG. 1, after the mounting unit of the device has been raised up as in FIG. 5 and after the mounting unit has been rotated into a latched configuration wherein the mounting unit is retained and temporarily secured in the service position.
Figure 7:
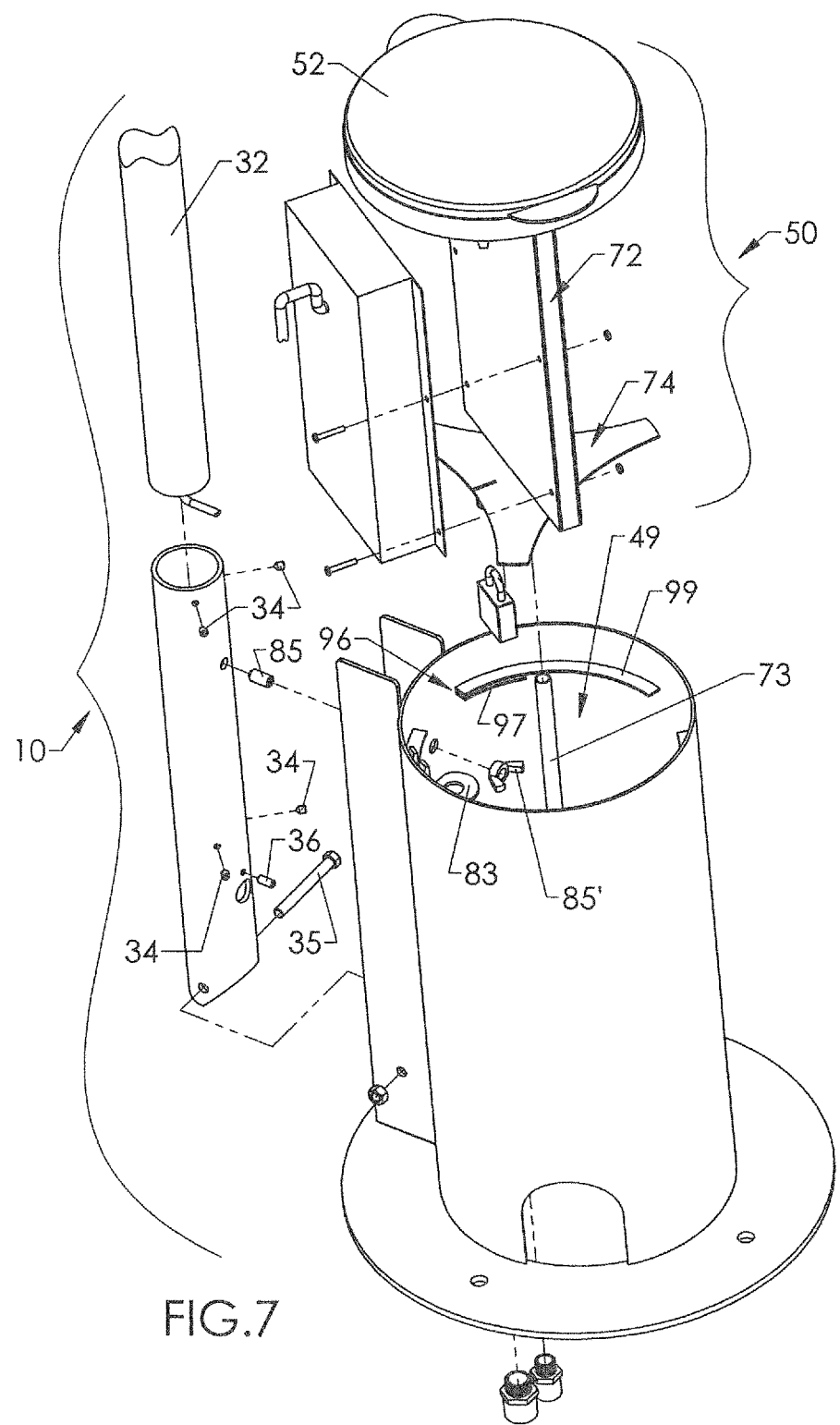
FIG. 7 is a side, exploded, isometric view of the embodiment of FIG. 1 (including said exemplary equipment/wires/cables).

The mounting unit 50 is shown in its in-use position in FIGS. 3A and B and 4A, being raised to the service position in FIG. 5, and in its service position in FIG. 6. An exploded view of mounting unit 50 is shown in FIG. 7.

In the in-use position, the mounting unit 50 is substantially received in and covered by the main body 20 when the mounting unit 50 is in the in-use position. The upper end of the mounting unit 50 comprises lid 52 with handles 54, which form the top of the device 10 and so are visible above the main body 20 even in the in-use position. The lip 56 of the lid 52 extends to or otherwise meets the top edge 22 of the main body, with little or no gap between the lip 56 and the top edge 22 of the main body 20. Further, an overlapping band 55 is preferably fixed to the lip 56 of the main body 20 and extends down over the lip 56 to covers whatever gap is present between lip 56 and edge 22. Therefore, no tool can be forced between lip 56 and edge 22, and it is difficult or impossible for the lid 52 to be pried off of the main body 20. Also, handles 54 are plate-like rigid protrusions that do not have any recess or curvature that would allow a tool to grab or wedge against the handles to an extent that would allow prying or otherwise forcing the lid open. One may note that a tool placed on or under the handles would tend to slide off rather than applying force sufficient to open the device.

By virtue of the materials and sleek design of the device 10, and the curved lid 52 and its banded joint with the sidewall 15, the device 10 is substantially or entirely weather-resistant or weather-proof. The curved, convex lid 52 (in top view), and the tight, vertical contact of the lip 56 of the lid 52 to the main body 20, and the smooth, continuous (except for apertures 26) sidewall, help provide said weather-resistance or weather-proofing. The apertures 26 at or near the bottom end of the sidewall 15 may allow some rain or snow into the lock space 48, but that rain/snow will lie below the lock L, preferably on the platform P. A liquid-resistant or liquid-proof seal such as a gasket or o-ring (not shown in FIGS. 1-11A, but shown in FIGS. 12-14) may be added between the lid 52 and the top edge 22 of the main body.

In addition to the lid 52, the mounting unit 50 further comprises a rigid frame unit that is rigidly connected to the lid 52 and that depends from the lid 52. The rigid frame unit comprises an upright portion (a generally vertical frame portion or "vertical frame portion 72") and a transverse portion (a generally horizontal frame portion or "horizontal frame portion 74"). The entire mounting unit 50 preferably is slidable, when unlocked, on an upright post 73 that is rigidly connected to the floor 46. For example, the mounting unit 50 has an axial bore (best seen in FIGS. 3A and 4A) that is slidably received on the post 73, whereby the post 73 serves as a guide for the axial sliding of the mounting unit 50 when a user lifts the mounting unit 50. Alternative guiding structure may be provided for guiding/easing axial sliding of the mounting unit 50 relative to the main body of the device.

The mounting unit may be locked into its "in-use" position by various locking mechanisms, but the preferred locking mechanism is one that is hidden and protected from most or all vandalism attempts. The preferred locking mechanism comprises a lock and a tab system, discussed further below, that holds the mounting unit 50 down inside the main body, and holds the lid 52 against the upper end of the main body to close the device 10. A further tightening mechanism (not shown), such as a ratchet or threaded-tightener, may be added to further pull the mounting unit 50 down into the main body for security and/or weather-proofing. Such a further tightening mechanism would preferably itself be locked and would be unlockable/operable only from a protected and secure position, such as inside the lock space 48 and/or underneath a locked cover (not shown).

Figure 8:
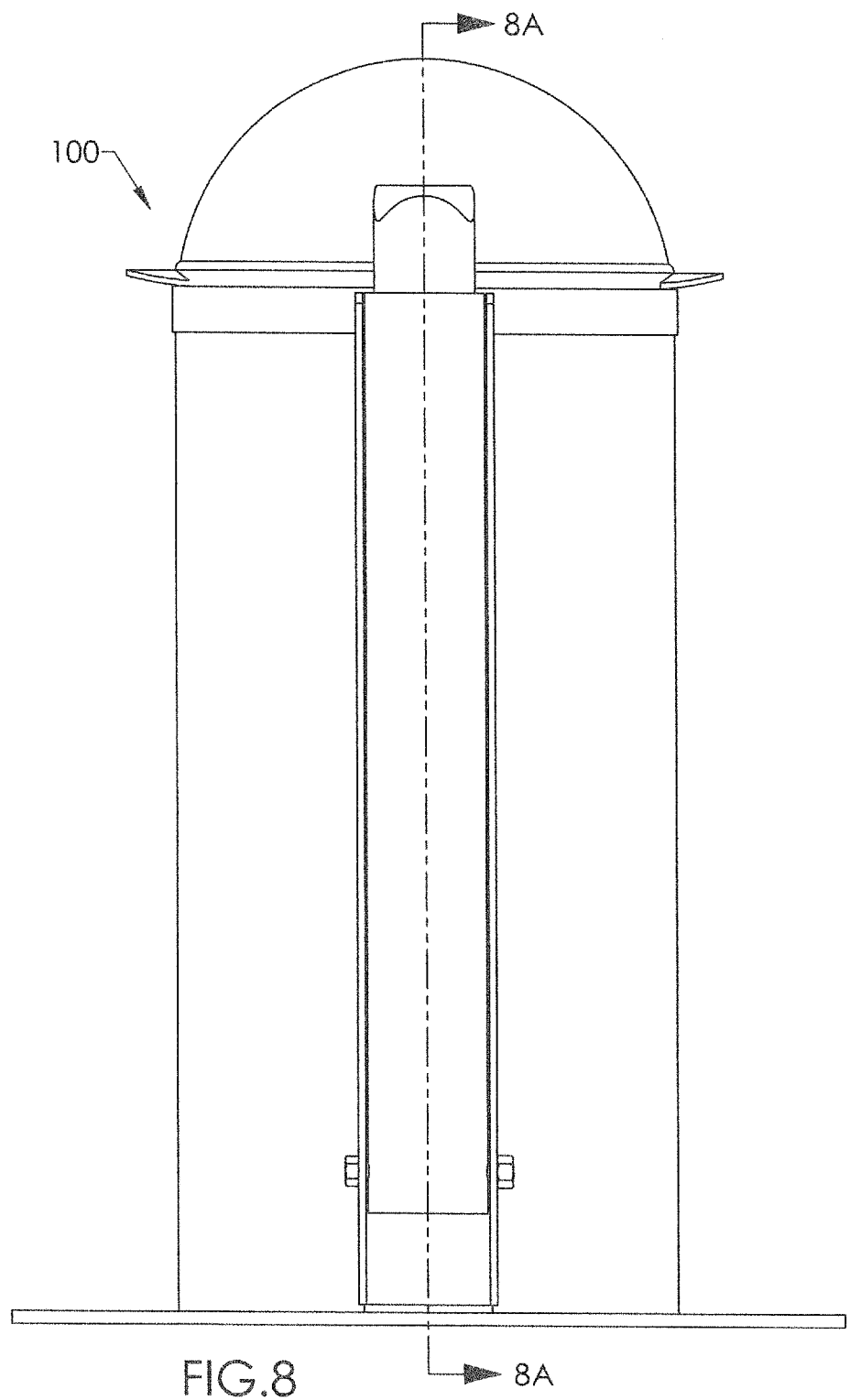
FIG. 8 is a side view of an alternative embodiment of the disclosed device, which comprises a top end dome that allows transmission of signals from, and/or receiving of signals by, an antenna that is received inside or under the dome.
Figure 8A:
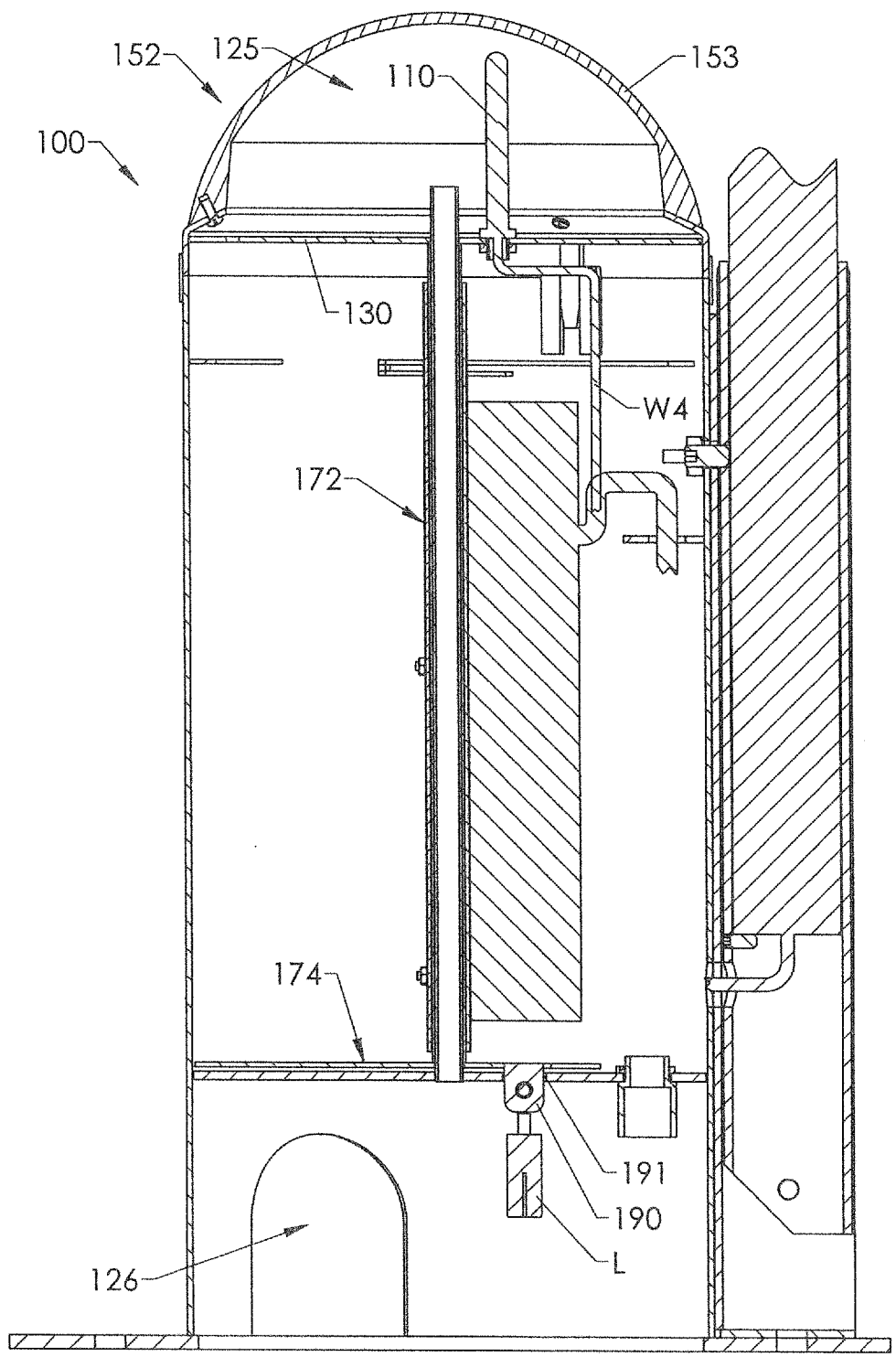
FIG. 8A is a side cross-sectional view of the embodiment of FIG. 8, viewed along the line 8A-8A in FIG. 8, wherein most of the device is the same as the embodiment of FIG. 1 except for the device-top antenna and its dome-cover, and wherein exemplary equipment and wires/cables are shown.
Figure 9:
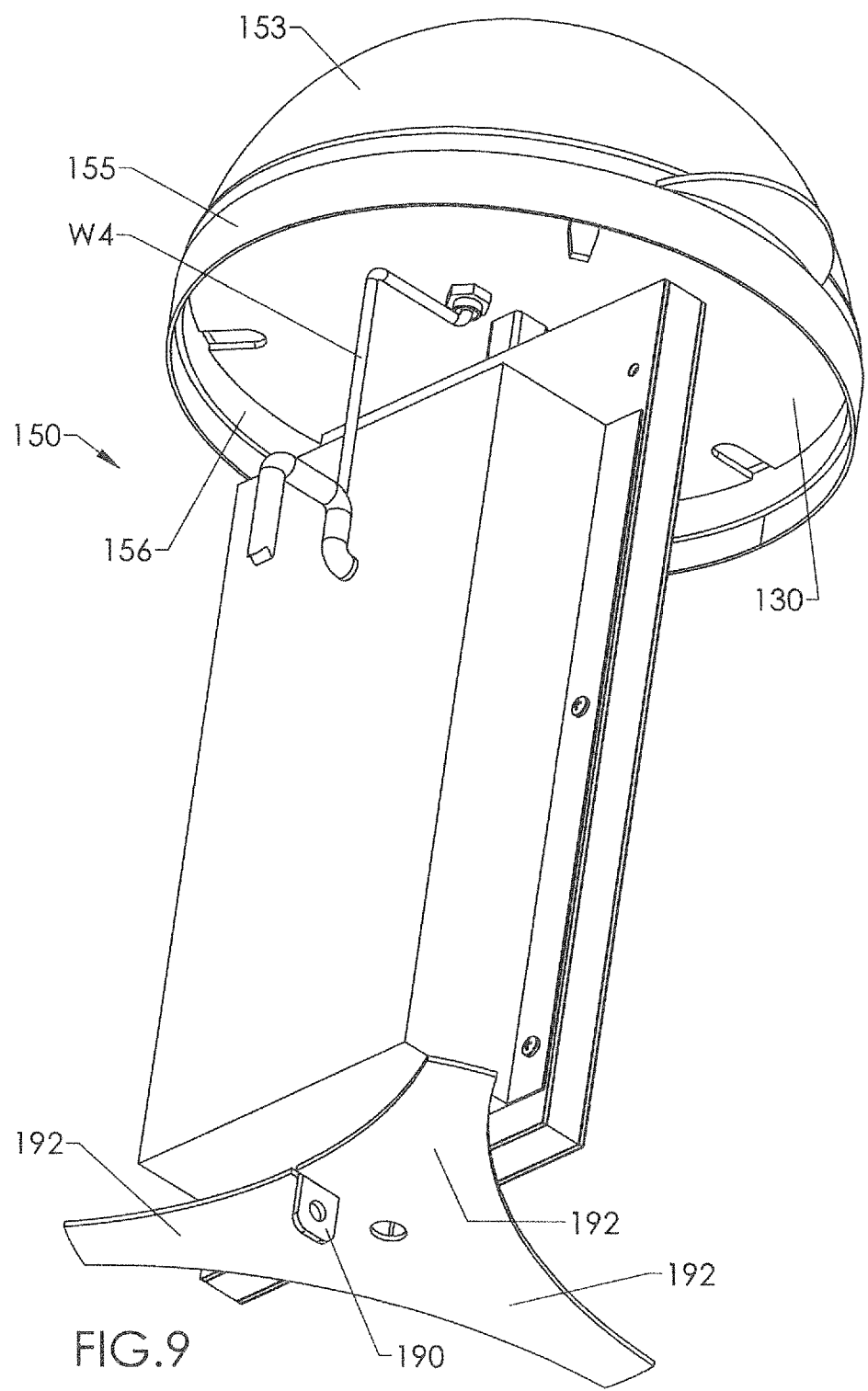
FIG. 9 is a bottom isometric view of the mounting unit, with antenna dome, of the embodiment of FIG. 8, shown with the exemplary utility equipment/wires/cables mounted on the mounting unit and connected to the dome-covered antenna.

A tab 90, or other locking extension, extends down from the mounting unit 50 and extends through a slot 91 in the floor 46 of the main body 20. While various shapes of the locking extension and slot may be used, it may be noted that tab 90 is a generally flat plate-shaped tab, and slot 91 is an elongated narrow slot; when the tab is in the slot, such shapes may help prevent rotation of the mounting unit on its axis relative to the main body. The lock L is therefore housed in a lock space 48, which is only accessible through small and narrow openings 26 that are "hand-sized" but not "tool-sized". Openings 26 at or near the bottom of the main body, for example, in the sidewall 15 of the main body 20, starting at and extending a short distance up from the bottom plate 12. There are preferably two openings 26, located about 90-130, and more preferably 100-120 degrees apart. These openings pass through the sidewall 15 of the main body to allow access by the authorized user to the lock space 48 inside the main body and below the mounting unit 50, as best shown in FIGS. 3A, 3B and 8A. These openings 26 are sized to be about 4 inches tall (vertical) and about 3.5 inches wide (horizontal) and to have curved/arched upper and side edges. The user may insert his/her hands and wrists through the openings 26, in order to manipulate the lock L and an unlocking device, for example, a key, magnetic strip, or computer chip controller (not shown) that unlocks/locks the lock. This way, the lock L is sheltered and protected in a lower, interior space of the device, wherein the user may reach it with his/her hands to unlock the lock L, but wherein a vandal will be unable or at least unlikely to break or cut the lock. The small, narrow openings 26 and the distance of the lock L from the openings (preferably 4-8 inches), will prevent a cutter, crow-bar, or other tool from being inserted and/or will prevent operation of a tool in a way that would result in the lock being broken or cut. Even if the head of a tool were inserted, the tool could not be manipulated and/or sufficient leverage could not be established, with the result being ineffectiveness of such a lock cutting or breaking endeavor. Some manual dexterity may be needed by the user to unlock the lock by inserting his hands through the apertures 26, but it will not be a very difficult task as the user may insert his/her two hands from two sides of the main body, at about 90-130 degrees from each other, and more preferably about 100-120 degrees from each other.

One may describe the interior space of the device 10 as equipment space 49 (called-out in FIG. 7), which receives vertical frame portion 72 and the horizontal frame portion 74 of the mounting unit 50, and exemplary utility equipment E mounted to the vertical frame portion 72. Frame portion 72 may be described as a plate structure, the opposite sides of which may each hold one or more pieces of equipment. Exemplary equipment (E) may be a controller, battery, data-logger, or other hardware, firmware, software and/or other elements for providing the control, monitoring, sensing, transmission or other services desired. In this example, wiring/cables W1, W2, and W3 operatively and electrically connect the antenna/mast 32 and the controller/equipment E and extend down out of the device, through a port in the platform P and then through the ground or conduit to cooperating adjacent or remote equipment. It may be noted that the wires/cables may be gathered/connected into a wiring harness. It may be noted that there are preferably no wires or cables that are exposed, except perhaps for antenna or solar panel wires or connections at or near the top of the antenna/mast. Frequently, but not necessarily, operative connection/communication with remote equipment will instead be by wireless communication via transmitter and receiver antennas.

When the mounting unit 50 is in-use inside the equipment space 49, one may see that the mounting unit 50 divides the equipment space 49 into multiple compartments, for example side-by-side compartments, such as first space 75 and second space 77 (or left and right spaces, respectively, in FIG. 3A), for receiving various utility equipment and associated wiring/cables. Alternatively, one may describe the first and second equipment spaces 75, 77 as spaces immediately adjacent to the upright frame/plate (vertical frame portion 72) that may receive equipment that is attached or hung on the upright frame/plate. Alternatively or in addition, as discussed above, the mounting unit may be designed with a longer locking extension/tab and with the horizontal floor being higher up inside the interior volume, to divide the equipment space into multiple compartments, for example, a lower equipment space and an upper equipment space. See FIGS. 12-14, for example, wherein the equipment space is effectively divided by the horizontal frame portion into a lower equipment space (for batteries) and an upper equipment space for equipment to be lifted, and the upper equipment space is further divided by the vertical frame portion into a left and right space.

While one side of the vertical frame portion 72 is shown supporting exemplary equipment E, the other side may also or instead support equipment; thus, spaces 75 and 77 may both contain equipment if desired. The equipment E or other hardware, firmware, software or other housed equipment may be bolted, hooked or otherwise attached to the vertical frame portion 72 or, alternatively, to other portions of the mounting unit 50 as long as they do not interfere with lifting of the mounting unit 50 to the "opened", raised, service position. On may note that the vertical frame portion 72 serves to connect the lid 52 and to the horizontal frame portion 74, so that lifting the lid 52 serves to lift the entire mounting unit 50. Further discussion of the mounting unit 50 and its operation is included later in this document.

Figure 4:
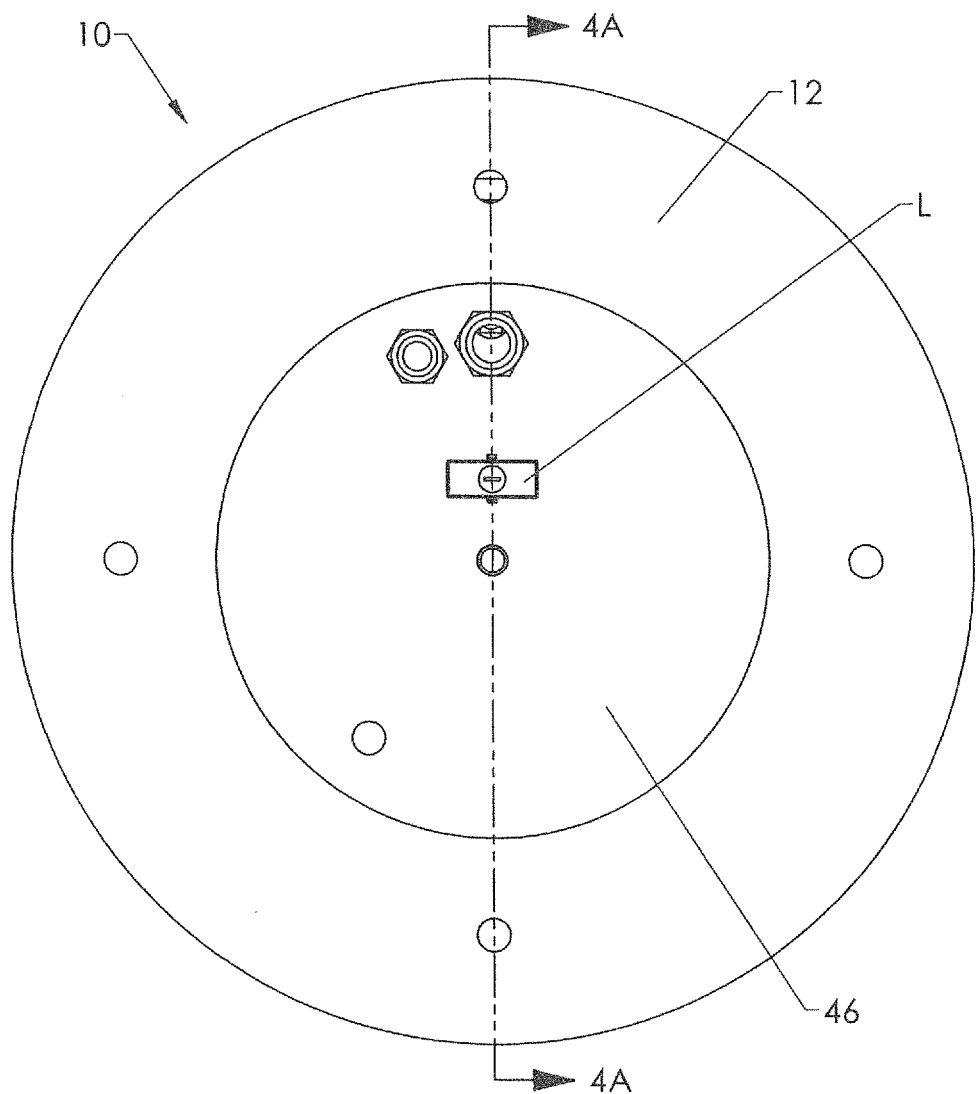
FIG. 4 is a bottom view of the embodiment of FIG. 1, removed from the concrete pad.
Figure 4A:
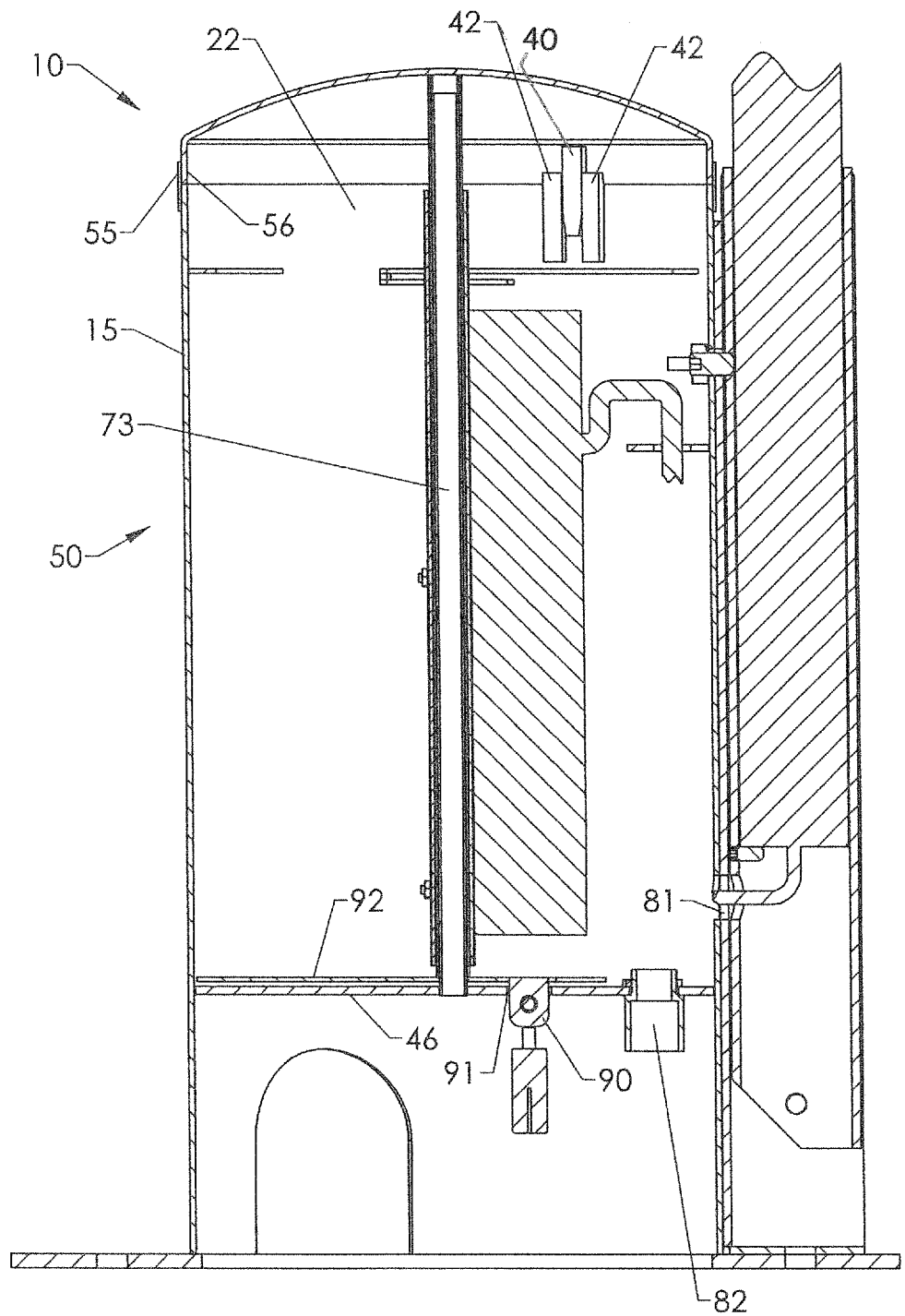
FIG. 4A is a cross-sectional side view of the embodiment of FIG. 1, removed from the concrete pad, as viewed along the line 4A-4A in FIG. 4 and with said exemplary equipment and wires/cables again shown.

Additional elements are included in the main body 20 for guiding and/or controlling the location of wires and cables. For example, apertures 81, 82 in the main body side wall and the floor 46, respectively, allow wires/cables to pass. Additional retainer elements, such as guide ring 83, may organize, retain and/or protect the wires/cables or other elements of the equipment. In FIG. 4A, some of the wires/cables are cut away to allow the viewer to better see the apertures 81, 82 and ring 83.

Figure 2:
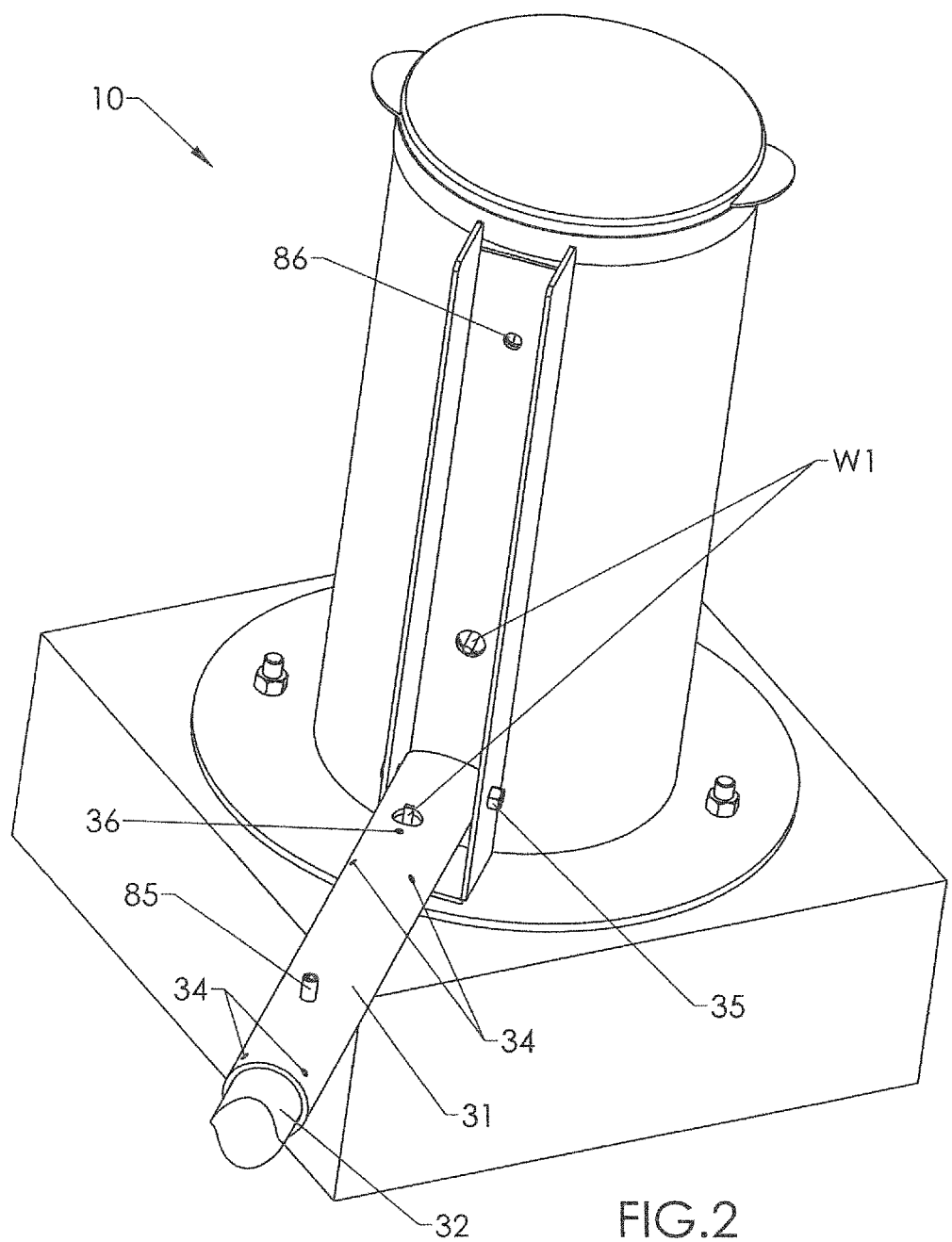
FIG. 2 is an isometric side view of the embodiment of FIG. 1, wherein the pivotal antenna/mast is lowered for easy access of the top end of the antenna/mast.

In FIG. 4A, one may also see to good advantage the pivot axle 35 of the antenna/mast holder tube 31. Also, in FIG. 4A, one may see one example of various possible fasteners for retaining the holder tube 31 in an upright position. The exemplary fastener is a threaded post 85 using a wing-nut head 85', so that a user may fasten and unfasten (latch and unlatch) the fastener without a tool. Wing-nut 85' threadably connects to a post 85 (threaded but not shown as such in the drawing for ease of drawing) extending from the tube 31 and through a hole 86 in the sidewall 15. Only with access to the equipment space 49 and the wing-nut 85', can a person unlatch the tube 31 for pivoting the antenna/mast to the convenient generally horizontal service position for maintenance (FIG. 2). It may be noted that FIG. 2 portrays the holder tube 31 and antenna/mast 32 pivoted downward to the service position with the device "closed" (the mounting unit 50 lowered into its in-use position). This view represents a situation wherein the mounting unit 50 has been unlocked from the main body 20 of the device to raise the mounting unit 50 for access to the interior space ("equipment space 49") and for allow access to the wing-nut 85' fastening the tube 31 to the sidewall 15. Upon unlatching (unscrewing) the wing-nut 85', the tube 31 and its antenna/mast 32 may be pivoted downward, and the mounting unit 50 lowered again to its closed position, in FIG. 2. To refasten the tube 31 and antenna/mast 32 in the upright position, they would be pivoted upward again, and the mounting unit 50 would be lifted again for the authorized user to re-latch (re-threadably fasten) the wing-nut 85' to the post 85.

With the antenna/mast holder 30 pivoted downward, as in FIG. 2, the antenna or mast is nearer to the ground for maintenance or replacement. This prevents the user from having to climb on a ladder or to bring a lift or other equipment that raises the user up to the top of the antenna/mast. Portions of the wire/cable W1 of the antenna/mast 32 are shown in FIG. 2 (cut for simplicity of drawing), and one of skill will understand that the wire/cable W1 will be continuous between the antenna/mast and the interior equipment E and/or other equipment inside, adjacent, or remote from the device, as needed for the particular utility service being provided.

Lifting the mounting unit 50 up relative to the main body 20 is illustrated in FIG. 5, and the resulting service position is illustrated in FIG. 6. Details of the entire device 10 may be seen to best advantage in exploded view FIG. 7. In the service position, the first and second spaces 75, 77 and the equipment contained therein are entirely or substantially above the top edge 22 of the main body. To accomplish this, the lock L is unlocked to free the mounting unit 50 to move upward relative to the main body 20. The user lifts the handles 54 of the lid 52 to lift the entire mounting unit 50 and the equipment it holds. If there are obstacles in the way of the arm outer ends 94, for example, dents or other inwardly-extending protrusions in the main body resulting from bullet holes or other impacts, the user may rotate the mounting unit 50 while lifting the mounting unit, in order to avoid said dents/protrusions. In other words, the user may typically maneuver the mounting unit around the dents/protrusions as he/she lifts and lowers the mounting unit 50. The mounting unit 50 translates upward, preferably not on any rails or tracks, but simply by sliding up relative to the main body, preferably guided by the slidable engagement of the vertical frame portion on post 73. One may note that unlocking and removing the lock L from the lock tab 90 allows the tab 90 to slide up through the slot 91 in the floor 46 when the mounting unit 50 is lifted.

The horizontal frame unit 74 of the mounting unit 50 comprises multiple, spaced arms 92, and the mounting unit 50 may be lifted with these arms 92 sliding up past elements such as the ring 83 that protrude inward from the sidewall of the main body. The spaces 93 between the arms allow the horizontal frame portion 74 to avoid said protruding structure as the frame mounting unit moves upward. The preferred configuration is three arms 92, spaced 120 degrees apart. The outer ends 94 of the arms amount to a small percentage of the circumference of the horizontal frame portion 74, for example, about 5-20 percent (a total of about 18-72 degrees of the 360 degree circumference), meaning that the spaces 93 between the outer ends 94 amount to a total of about 95-80 percent (being about 288-342 degrees of the circumference). These widely-spaced, narrow-ended arms allow for lots of room (the scallop-shaped spaces 93) to bypass any structure on the inner side of the main body sidewall.

Typically, lifting the mounting unit 50 to, and latching the mounting unit 50 in, the service position shown in FIG. 6 is desirable. In this raised-but-not-removed, service position, the bottom of the mounting unit 50 and the arms 92 are slightly below the uppermost extremity (top edge 22) of the main body, for example, about 2-4 inches below said top edge 22. This position allows access to all the equipment on the frame portions 72, 74. The wires/cables slidably extend through the guides and apertures, and are of sufficient length, so that the wires/cables do not prevent the mounting unit 50 and the equipment E it holds from being lifted to the service position. Alternatively but less preferably, the mounting unit 50, and its slidable engagement with the upright post 73, may be adapted so that the unit 50 may be lifted all the way out of the main body and/or lifted and set to one side of the main body (for example, on a table/shelf beside the device 10, but this may require even longer wires/cables and/or disconnection of the wires/cables.

Once the mounting unit 50 is lifted to the point where the arms 92 are level with the internal circumferential rim systems 96, the mounting unit 50 is manually rotated on its longitudinal axis to move the outer ends 94 of the arms 92 to slide into the slot formed between the lower rims 97 and the upper rims 99, which slot is closed on one end by an end plate or "stop" 98. With the outer ends 94 thus resting on the lower rims 97, and below the upper rims 99, the user may release his/her hold of the mounting unit 50, and the unit 50 will rest on the lower rims 97 without tipping/tilting and its equipment will be substantially above the main body for easy access. There are three sets of upper and lower rims, a set for each arm 92, with short gaps between the three sets. The upper rims 99 are longer than the lower rims 97, so that the upper rims 99 are stops against upward-lifting; the user may lift until the outer arms 94 hit the upper rims 99 and then rotate the arms into the slots. This provides sure and easy operation of the lift-and-latch system for raising the mounting unit 50. Gaps between the ends of the longer rims (upper rims) are slightly wider than the outer ends 94 of the arms, and allow the user to lift the mounting unit 50 all the way out of the main body if desired.

Preferably, the outer ends 94 are each about 1.5 inches wide (circumferential length) and the gaps between rims 99 are each about 2 inches wide. The rim system 96 is preferably about 1 inch from the top edge 22 of the main body 20, which helps to reinforce/strengthen the upper end of the main body and which allows the user to lift the mounting unit 50 slightly past the rim systems 96 (by accident or by plan for any reason) without lifting the mounting entirely out of the main body.

With the mounting unit 50 in this service position, the user may access both sides of the vertical frame portion and the equipment connected thereto, to test, open, replace, repair, and/or adjust the equipment E and its accessories or wires/cable. The equipment E will typically be at about chest or shoulder level for a user standing next to the device 10 and this provides a comfortable way of servicing, testing, or repairing the equipment. One may note that this system of accessing the equipment E is very convenient and comfortable compared to the user kneeling or stooping over the utility pedestal and reaching into a dark and cramped utility pedestal through a door in the utility pedestal "cabinet-style" housing.

When the mounting unit 50 is returned to the in-use position inside the main body, it is desired to conveniently and accurately insert the tab 90 through slot 91 for relocking of the device. In FIG. 4A, one may see to best advantage an indexing system that is the preferred way to accomplish this. The indexing system comprises two spaced bars 40 near the top edge 22 of the main body 20 of the device 10, and a generally pointed central bar 42 attached to and extending down from the lip 56 of the lid 52. The mounting unit 50 is lowered into the main body 20 in an orientation that places the central bar 42 between the two spaced bars 40, and, as lowering of the unit 50 continues, the slanted/pointed end of the central bar 42 slides against the other bars 40 to center the bar 42 between the spaced bars 40 without bar 42 catching on or being held-up. This indexing system ensures that the mounting unit 50 is properly aligned inside the main body so that lock tab 90 slides down through the tab slot 91 for proper installation of the lock L through the eye in the tab 90.

It should be noted that the indexing system may instead or additionally serve another purpose, that is, to prevent undesired rotation of the lid and/or mounting unit as long as the central and spaced bars are in contact. Thus, the central bar and spaced bars are one example of an embodiment of a rotation stop system. The central bar 42 protruding down from the lid and being placed/captured between the spaced bars 40 fixed to the main body of the device, prevents the lid and, hence, the mounting unit, from rotating relative to the main body. This may be particularly beneficial in embodiments, wherein the lid is threadably connected to the vertical frame portion, to prevent an authorized person from rotating the lid off of the device. An authorized person, on the other hand, may unlock the mounting unit and raise the mounting unit (and lid) to a certain extent, specifically, to an extent that the central bar 42 rises above, and hence clears, the spaced bars 40. Then, if needed, the authorized person may rotate the lid off of the other portions of the mounting unit. See also the discussion regarding FIGS. 12-14, below.

FIGS. 8-11A illustrate an alternative embodiment, utility pedestal device 100, which is very similar to device 10 except that device 100 is fitted with an antenna 110 inside a dome cover 153 at the top end of the device 100, preferably as part of the lid unit 152. The antenna 110 may be a compact, high efficiency antenna, for example, an iridium satellite antenna, and the dome cover 153 may be a fiberglass or plastic dome that allows high-quality transmission and/or reception of signals by the antenna 110 through the dome 153. Wiring/cabling W4 is included for operative connection to the other equipment E. The antenna 110 is inside the space 125 formed by the convex undersurface of the dome 153, and wires/cables W4 extend from the antenna through a baseplate 130 of the lid.

Figure 10:
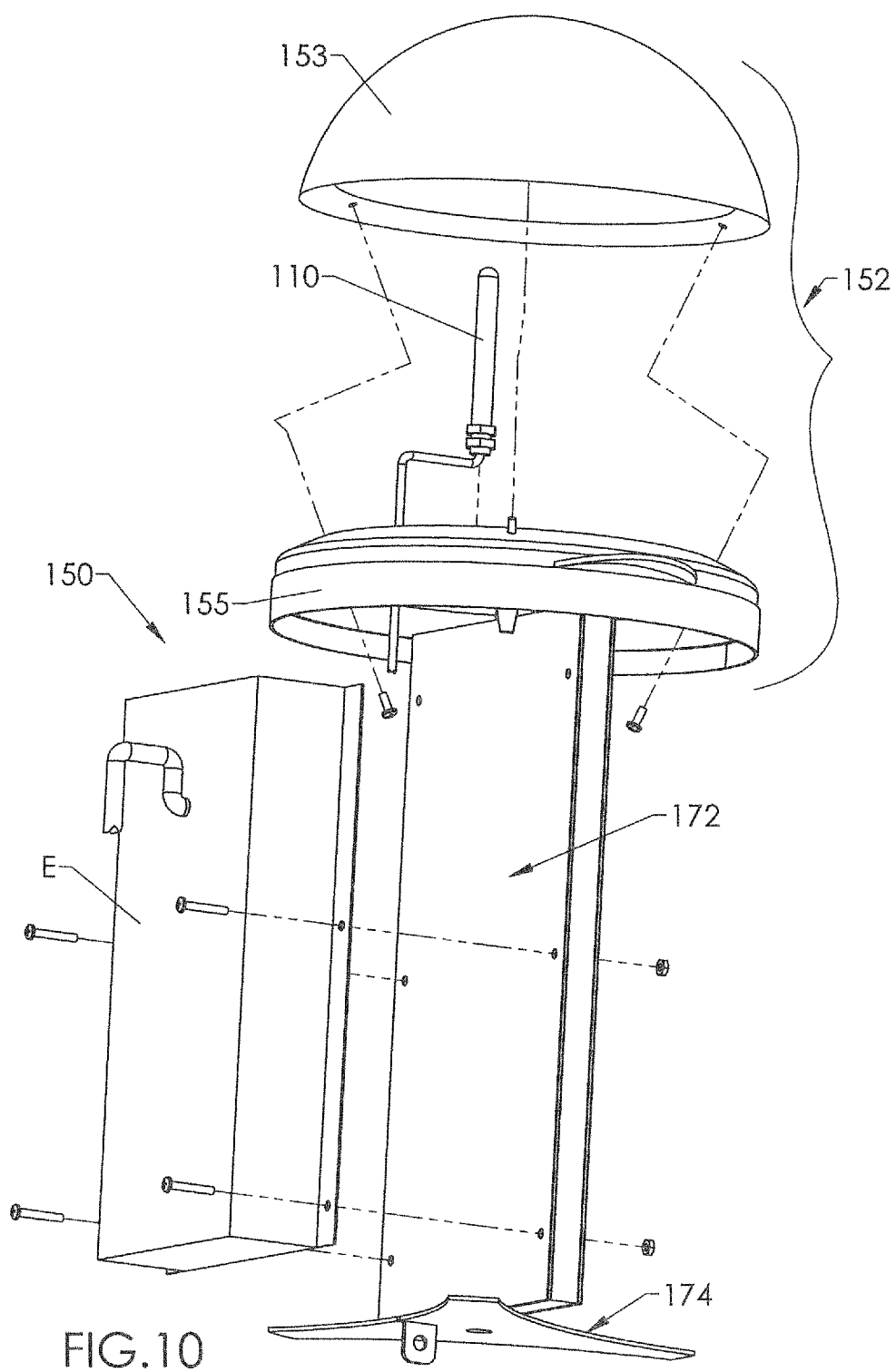
FIG. 10 is an exploded, side, isometric view of the mounting unit of FIG. 9 (with exemplary equipment/wires/cables).
Figure 11A:
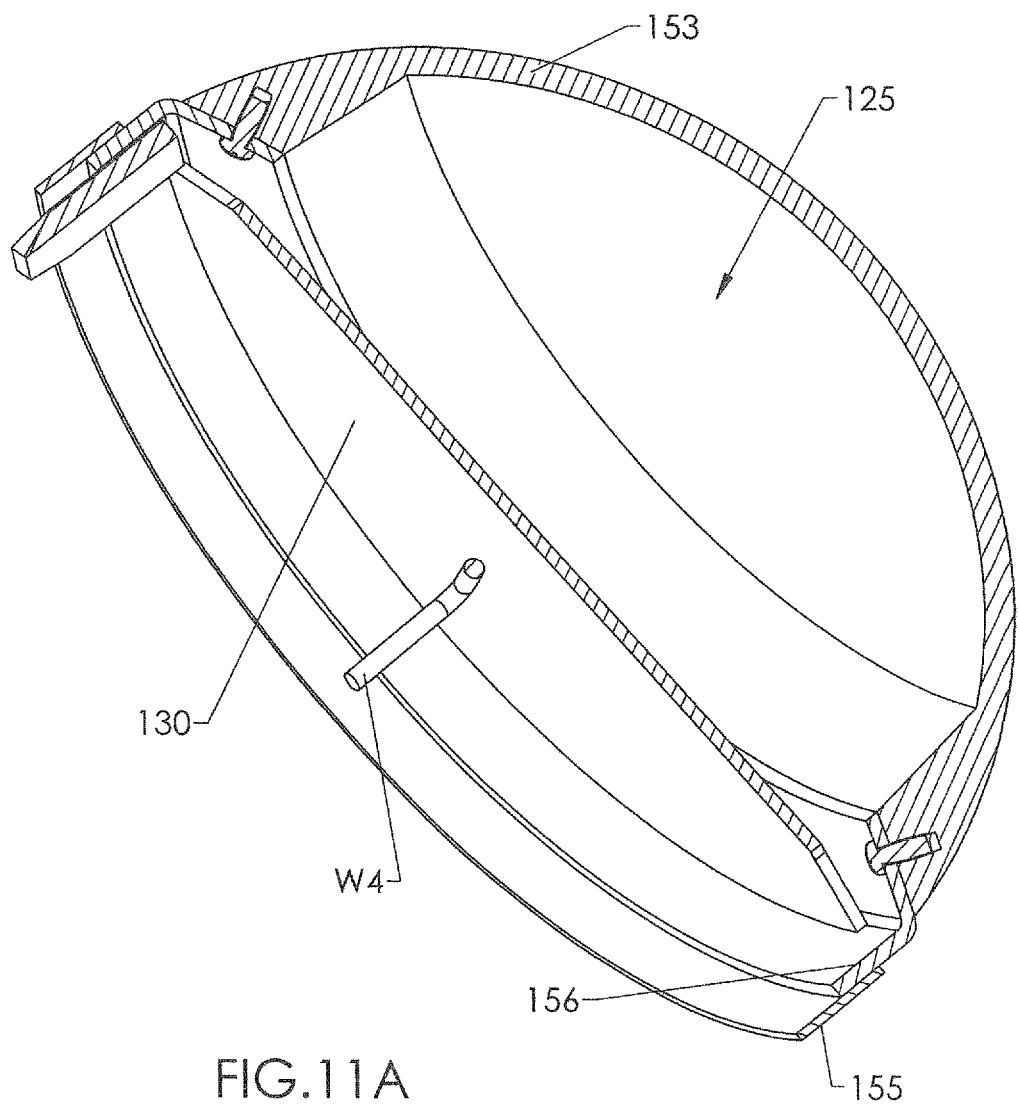
FIG. 11A is a cross-sectional isometric view of the dome portion of the mounting unit of FIG. 9, viewed along the line 11A-11A of FIG. 11.

FIGS. 10-11 shows to best advantage the upright frame (vertical frame portion 172) and the horizontal frame portion 174 of device 100. Portion 174 comprises multiple arms 192, spaced apart by spaces (similar to spaces 93) similar or the same as those discussed above for device 10. The lid 152 is detailed in FIG. 11A, including the lip 156 and band 155 that contact and/or seals against the upper end of the main body of the device in a way that is so tight or flush against the main body sidewall that makes it very difficult or impossible to pry the lid 152 from the main body. The lid 152 is designed to be tamper-resistant or tamper-proof, and the steel baseplate 130 is especially adapted to prevent unauthorized access to the equipment space (149) below the baseplate 130. Even if a vandal breaks through dome 153, it will be difficult or impossible to break through the baseplate 130 to reach the equipment inside the device. Note tab 190 extending through slot 191 for receiving lock L, in the same manner as described above for device 10.

Figure 12:
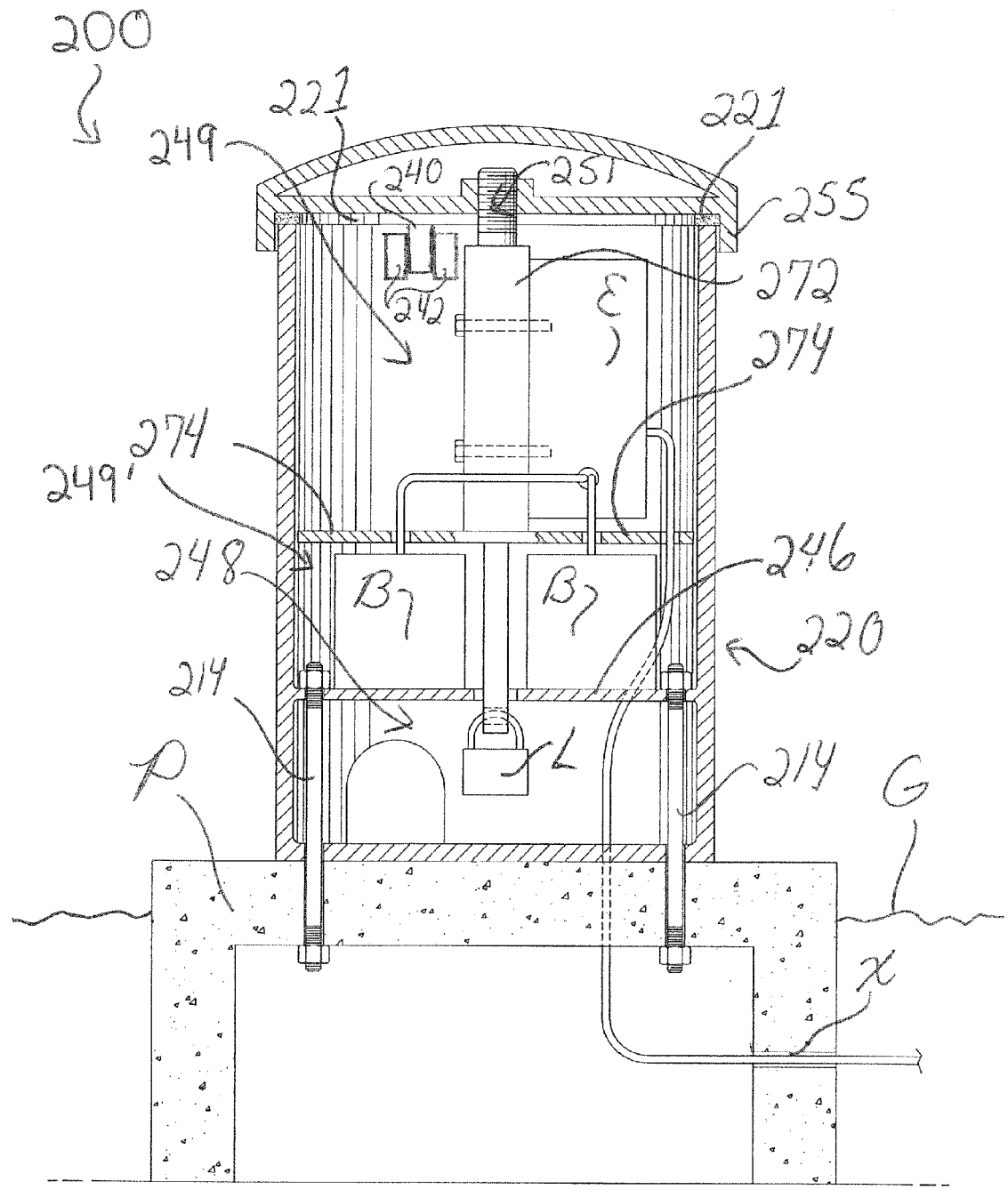
FIG. 12 is a schematic, cross-sectional view of an alternative embodiment, locked in the in-use position.
Figure 13:
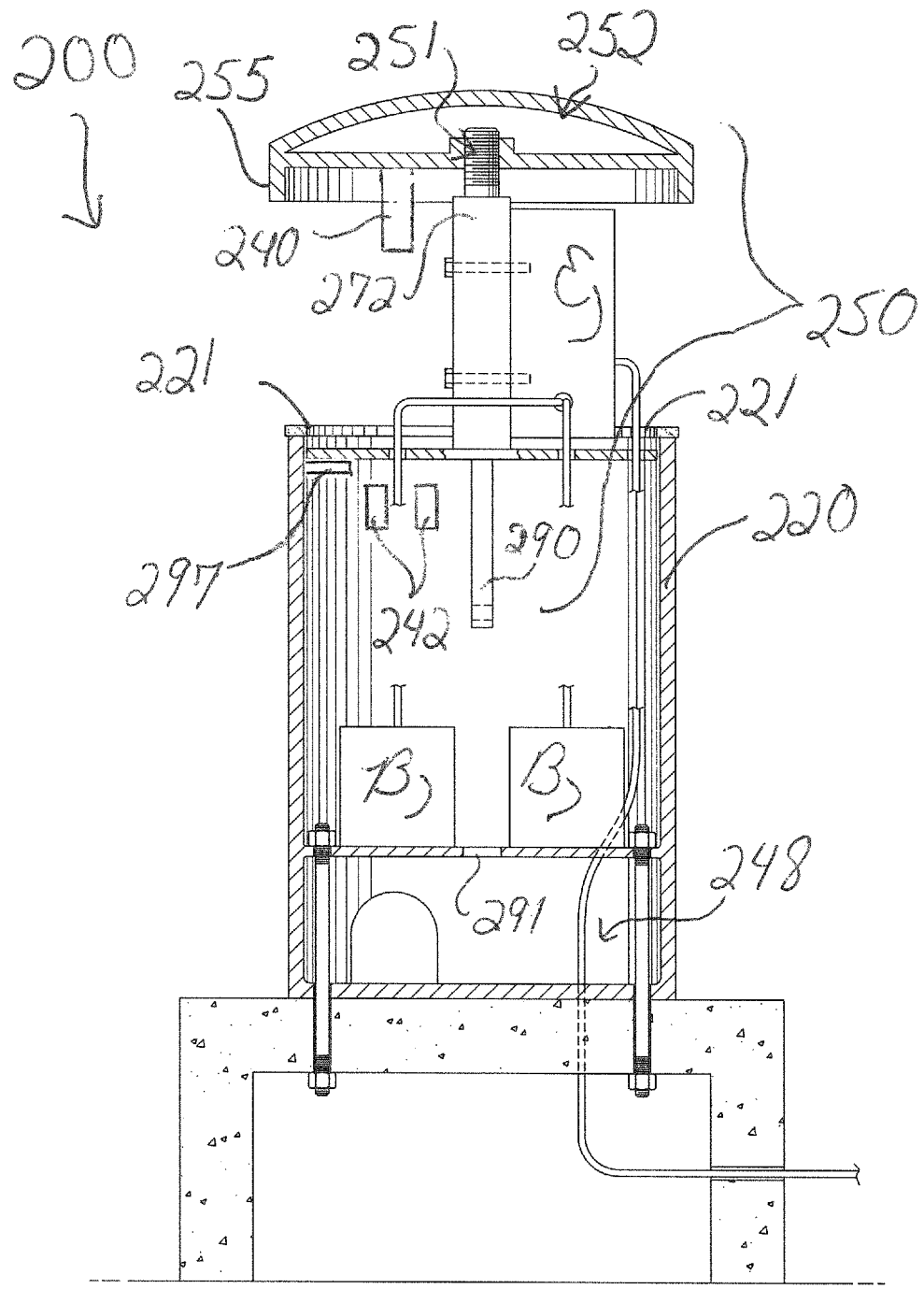
FIG. 13 is a schematic, cross-sectional view of the embodiment of FIG. 12, with the mounting unit unlocked and raised to a position wherein the equipment in the upper equipment space is easily reachable by an authorized user.
Figure 14:
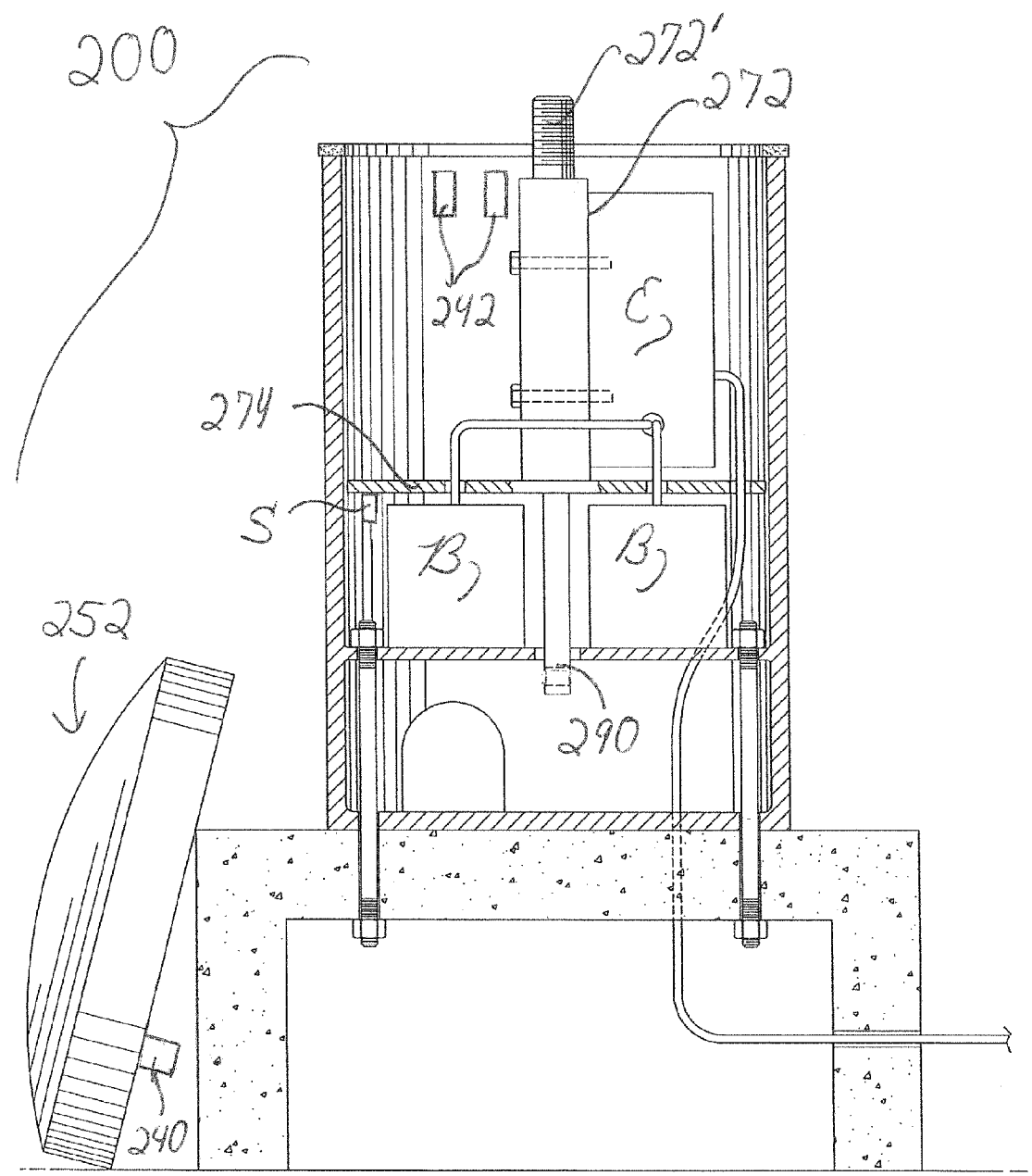
FIG. 14 is a cross-sectional view of the embodiment of FIG. 12, wherein the lid has been removed from the device, by rotating the lid after the mounting unit has been unlocked and raised slightly to clear the rotation stops, and the lid-less mounting unit has been lowered back down to rest inside the main body.

FIGS. 12-14 schematically portray an alternative embodiment of the device 200, that includes alternative or optional features that may be beneficial in certain embodiments. Device 200 is designed much like the earlier-described embodiments, and may be seen to have many of the same features/elements, which are not specifically called-out in FIGS. 12-14 because these features/elements will be understood from the earlier description and from FIGS. 1-11A. Device 200 may function similarly to those earlier-described embodiments, with some exceptions/additions as described hereafter.

One may see an example of a gasket 221 or other seal for creating a liquid seal between the main body 220 and the lid unit 252. The lid depending band 255 is shown as an alternative version compared to that in devices 10 and 100, and it will be understood that adaptations to further improve tamper-resistance may be made to the lid unit 252 and the band 255, for example, as described above for devices 10 and 100.

Device 200 comprises a bottom wall 212, but does not include any flange (12) extending out beyond the footprint of the main body 220. Instead of using bolts/fasteners through an outward-extending flange (12), connection of the main body 220 comprises multiple bolts 214 or other fasteners extending from the device 200 into/through the platform P that is shown partially and securely buried in the ground G. For example, the bolts/fasteners 214 may extend through the floor 246, through the lock space 248, and into/through platform P, so that said bolts/fasteners 214 are not accessible by unauthorized people. Two bolts 214 are shown, but preferably more, or less preferably fewer, may be used. A flange (12) extending out beyond the footprint of the main body may be optional especially in embodiments that do not include an antenna/mast holder.

Mounting 250 of device 200 is structured so that the generally horizontal frame portion 274 is higher up in the interior volume of the main body 220 when the mounting unit 250 is in it lowered, in-use position, as shown in FIG. 12. This provides an upper equipment space 249, above the horizontal frame portion 274, and a lower equipment space 249' between the horizontal frame portion 274 and the floor 246. The upper equipment space 249 is used for equipment/elements E that a user/technician wants to easily access for data retrieval, maintenance, or replacement and that are of a weight that lends itself to being connected to, and relatively-easily lifted with, the mounting unit 250.

Therefore, as shown in FIGS. 12 and 13, the lower equipment space 249' is used for heavier and/or less-frequently-accessed equipment/elements (such as batteries B), because the mounting unit 250 does not hold or carry the equipment (B) that resides in space 249', and raising mounting unit 250 will not lift or move that equipment (B). This way, heavy batteries or other heavy equipment may be left at the bottom of the equipment space (in the lower space 249') when the user/technician lifts the other equipment E up with the mounting unit to the raised "maintenance" position shown in FIG. 13. Note that, in FIG. 13, the wires/cables are shown only partially, and it will be understood that sufficient length of wires/cables will be needed to allow the equipment E in the upper equipment space 249 to be distanced, a greater amount than when in the in-use position, from the batteries B or other connected equipment/elements. For example, equipment E in FIG. 13 is farther from the platform exit X and farther from the batteries B, than in FIG. 12. This embodiment is not shown to have an antenna or antenna mast holder, but if it did, the equipment E would also be farther from the wiring/cable W1 connection to the antenna. Hence, extra length of wires/cables will typically be provided to allow for raising of the mounting unit 250 and the equipment E.

One may see to best advantage in FIG. 13 that the tab 290 or other locking extension may need to be longer, than in devices 10 and 100, to account for the greater distance between the horizontal frame portion 274 and the floor 246 and lock slot 291. One may also see (only) in FIG. 13, that a rim 297 or other ledge or support may be provided on which the mounting unit (for example, an outer end of an arm of the horizontal frame portion 274) may rest when the mounting unit 250 is lifted to the maintenance position. The rim 297 is shown schematically for device 200 in FIG. 13; it will be understood that it could be the same or similar to the internal circumferential rim systems 96, described above, or another support that does not interfere with lifting of the mounting unit 250 but that allows hands-free resting of the mounting unit once it is raised. Preferably, the support is normally in place for use when needed, but alternatively (less-preferably) could be moved into position or inserted/installed when needed.

A threaded connection 251, or other detachable connection, may be provided between the vertical frame portion 272 (or a post 272' upending from it) and the lid unit 252. A threaded connection is particularly beneficial as it is tamper- or vandalism-proof or tamper- or vandalism-proof resistant, but is may allow access in the event the mounting unit 250 cannot raised fully to the maintenance position shown in FIG. 13. If the main body 220 is dented, or the mounting unit 250 damaged, to an extent that prevents the mounting unit 250 from being raised fully to the raised maintenance position shown in FIG. 13, the thread connection 251 may be used to gain access to the equipment space 249 and equipment E. After unlocking and removing the lock L to free tab 290, the mounting unit is raised a small amount, at least to an extent that will raise the central bar/member 240, which are rigidly and non-bendably fixed to the lid unit 252, to a position above the spaced stops 242, which are rigidly and non-bendably fixed to the main body 220. One may see central member 240 between spaced stops 242 in FIG. 12, and it will be understood that this relationship will prevent rotation of the lid unit 252 in either direction relative to the main body, and, hence, prevent rotating/turning the lid unit to disconnect the threaded connection 251. Thus, once the lid and mounting unit are (unlocked and) lifted enough that the central member 240 clears the stops 242 (a few inches, for example, 1-4 inches), the lid may be rotated off of the threaded connection 251. Typically, the denting or other damage that prevents the mounting unit 250 from being fully raised, and/or other adaptations to prevent the lower portions (frame portions 272, 274) from rotating freely, will allow the user to rotate the lid unit relative to said lower portion, to free the lid. For example, certain embodiments of the tab 290 will be long enough to remain in the slot 291 when the lid and mounting unit are lifted said few inches, anchoring the lower portions sufficient to allow the user to rotate the lid unit off. Or, in certain embodiments, the user may lift the lid and mounting unit far enough to grasp the vertical frame portion and/or equipment, to allow rotating of the lid off the vertical frame portion.

Once the lid is rotated off of the mounting unit, the lid unit 252 may be set to the side, and the mounting unit may be lowered said few inches down to, or close to, its normal, in-use position, as shown in FIG. 14. The user may then reach down to handle/maintain the equipment E.

It may be noted, in FIGS. 12-14 that the mounting unit 250 is slidable down inside the main body to a point wherein the lid normally stops it from further downward sliding. Note that the device 200 is not shown with a post (73) for guiding axial-sliding, but it will understood from this document how to provide one and/or other sliding guide(s) if needed. When the lid is removed, the remaining portions of the mounting unit may slide further down into the main body, for example, limited by frame portion 274 resting on the batteries or other equipment in lower space 249' or by other stops or supports that may be provided in the main body. The mounting unit 250 in FIG. 14 is shown not quite resting on the tops of the batteries B, but is shown instead (in FIG. 14 only) resting on a schematic support S. The schematic support S may support the mounting unit 250 in the in-use position but not interfere with raising of the unit 250.

General Comments

Certain embodiments may be described as a protective housing device for utility equipment, the device comprising, consisting essentially of, or consisting of:

a main body comprising a sidewall defining an interior space or "interior volume";

a mounting unit that is slideable axially inside the main body from an in-use position substantially or entirely inside the main body to a maintenance (or service) position raised substantially or entirely from the main body, the mounting unit comprising a lid that seals or tightly mates to an upper portion of the main body when the mounting unit is in the in-use position, and the mounting unit being adapted to hold one or more pieces of said utility equipment in locations on the mounting unit that fit into the main body when the mounting unit is in the in-use position;

a lock that is provided inside the main body and underneath the mounting unit in a lock space, the lock adapted to retain the mounting unit inside the main body in a fully-lowered position that is the in-use position, and, when unlocked, the mounting unit is liftable to said service position; wherein:

the device comprises a lower portion of the main body, or alternatively a bottom skirt or bottom cover, that prevents access to the lock except through small and narrow apertures through said lower portion (skirt or cover), the device and said apertures being adapted so that a user's hands, with a key or key-card, fit through the apertures to unlock the lock, but wherein tools will not fit through the apertures and/or tools will not be effectively operable through the apertures (or in the small lock space) and so will not be usable for cutting or breaking the lock.

Said mounting unit may comprise a bottom frame of arms spaced-apart so that gaps between the arms provide space for the bottom frame to slide upward and downward while avoiding protruding elements inside the main body. The mounting unit may slide on a central axis upright post, for example.

Said mounting unit may comprise multiple of said arms, for example three arms, wherein there are wide and large scallop-shaped spaces between the arms. Said main body may have structure such as ledges and/or slots, adapted to cooperate with the arms to hold the arms, and hence the mounting unit, in the raised, service position. Preferably, the provision(s) for retaining the arms in the service position require no tools or difficult actions by the user. Said structure may comprise horizontal/circumferential rims/ledges/tabs that retain the arms of the mounting unit in the service position once the mounting unit has been lifted most of the way up from the main body. In the preferred case, simple rotation of the mounting unit to place the arm ends in slots between the rims will retain the mounting unit in the service position, and, simple rotation in the opposite direction will remove the arm ends from the slots so that the mounting may be lowered to the in-use position. Said rims may each comprise an upper rim and a lower rim, with a closed end, to form the slots for receiving each of one of the arms, after rotation of the mounting unit on its longitudinal axis.

The mounting unit preferably is movable in the main body, for lifting it to the raised position, preferably without any rails, rollers, or other guides or connections between the mounting unit and the sidewall of the device. Alternatively, however, rails, rollers, or other guides between the mounting unit and the sidewall may be used if desired in certain embodiments.

Preferably, the mounting unit rests free and unencumbered inside the main body, except that the mounting unit slides axially along an upright post that extends up through a bore in the mounting unit. Preferably, the only elements that may be considered attachments of the mounting unit to the main body are the mounting unit's slidable engagement with the central axis upright post, the lock system (when it is locked), and by wires/cables that pass to other equipment or outside of the device. The mounting unit is preferably only constrained from being lifted if the arms abut into elements inside the main body, and, therefore, the mounting unit should be rotated to a position for/during the uplifting wherein the mounting unit is free to slide upward. Optionally, the slidable engagement between the mounting unit and the central axis upright post may include a limit that prevents the mounting unit from being entirely lifted away from the upright post. The mounting unit is rotatable on the upright post, so that the mounting unit may be rotated/adjusted to a position wherein the arms of the bottom frame (bottom end) of the mounting unit bypass the protrusions extending from the inner surface of the sidewall into the equipment space, and so that the mounting unit may then be rotated for engagement in the horizontal/circumference rims to hold the mounting unit in the service position. Flexible wiring/cables of sufficient length, and/or that are slidable relative to any ports they pass through or elements they contact, will help with the unencumbered lifting of the mounting unit and its contents.

An optional but beneficial feature is an antenna/mast lowering system that may be actuated by an authorized user. Preferably, the antenna or mast, for example, for communications or for solar power production by a panel on a mast, extends several or many feet above the device main body. In normal use, the holder for the antenna/mast is upright and is locked so that the top of the mast/antenna would not be reachable except by a ladder or large equipment. Further, the antenna/mast is secured in the holder in a way that prevents a vandal from removing the antenna/mast. When maintenance is needed on the top end of the antenna/mast, an authorized user may access the latch that keeps the holder in the upright position and may lower the antenna/mast by pivoting the holder downward. Typically, the authorized user reaches said latch by unlocking of the same lock system that allows the user to access the equipment inside the main body. Thus, the latch for the antenna/mast holder may be inside the main body, protected from vandalism or casual manipulation of the holder or the antenna/mast.

Certain other embodiments may be described as a protective housing device for utility equipment, the device comprising, consisting essentially of, or consisting of:

a main body comprising a sidewall defining an interior space or "interior volume";

a mounting unit that is axially slideable inside the main body from an in-use position substantially or entirely inside the main body to a maintenance (or service) position raised from the main body to allow access above the main body to at least some of the equipment, and/or to a lid-removal position that allows a lid of the device to be removed for access to said at least some of the equipment by the authorized person reaching down into the interior volume;

the mounting unit comprising said lid that seals or tightly mates to an upper portion of the main body when the mounting unit is in the in-use position, and that optionally is removable when the device is unlocked and the mounting unit raised to an extent that allows removal of the lid (the "lid-removal position"); wherein the mounting unit is adapted to hold one or more pieces of said utility equipment in locations on the mounting unit that fit into the main body when the mounting unit is in the in-use position;

a lock that is provided inside the main body and underneath the mounting unit in a lock space, the lock adapted to retain the mounting unit inside the main body in a fully-lowered position that is the in-use position, and, when unlocked, the mounting unit is liftable to said service position and/or to said lid-removal position, wherein:

the device comprises a lower portion of the main body, or alternatively a bottom skirt or bottom cover, that prevents access to the lock except through small and narrow apertures through said lower portion (skirt or cover), the device and said apertures being adapted so that a user's hands, with a key or key-card, fit through the apertures to unlock the lock, but wherein tools will not fit through the apertures and/or tools will not be effectively operable through the apertures (or in the small lock space) and so will not be usable for cutting or breaking the lock.

Water proofing may be used to make the device effective in flash floods, hurricanes or other wet conditions and insect/spider/ant-proofing may be effective for personnel as well as equipment protection. Certain embodiments may comprise sealing for water-resistance, water-proofing, and/or insect- and spider- and ant-protection. For example, seal(s) between the lid of the device and the main body of the device, at and around any apertures for wiring or other elements (such as at hole 86, wiring apertures for wires/cables W 1, or other holes/seams/apertures) may be useful for protection from both water and insects/spider/ants. Certain embodiments may also comprise seal(s) inside the device, for example, around/in the locking tab slot, to prevent insects/spiders/ants from crawling up into the equipment space from the lock space.

The lid may be an upper portion of the mounting unit, and may be of various durable designs that are resistant to prying of the lid from the main body. The lid may comprise a space for receiving an antenna, such as an iridium satellite antenna, and the lid may have a dome over the antenna that allows excellent transmission of signals from and to the antenna. In addition to a tight closure of the device ensured by the tab and slot lock system, an additional tightening means, such as a ratcheting mechanism or lever-actuated tightener, may be used to ensure a tight and pry-resistant closure between the lid and the sidewall of the device.

Note that set screws, nuts and/or other connections/fasteners may be welded in place, if desired, to prevent tampering. Also, elements that are rigidly joined may be integrally formed, welded, or otherwise permanently joined to create rigid and durable structure.

Certain other embodiments may be described as: A temper-resistant housing for equipment comprising:
a main body comprising having an interior space, the main body comprising a generally vertical sidewall having a bottom end and a top end, and a generally horizontal floor inside the interior space between the bottom end and the top end;
a mounting unit sliding inside the main body from a lowered position, wherein the mounting unit is substantially inside the main body, to a raised position wherein the mounting unit is substantially above the main body, the mounting unit having a lid, a generally vertical frame portion depending form the lid, and a generally horizontal frame portion at or near a bottom end of the generally vertical frame portion, wherein the mounting unit comprises an upper equipment space between the lid and the generally horizontal frame portion for receiving equipment being housed in the housing;
a lock connecting the mounting unit to the main body and located inside a bottom portion of the interior space beneath said floor;
and preferably, in many embodiments, wherein the sidewall of the main body further comprises an opening through the sidewall into said bottom portion of the interior space for access to the lock. The opening is preferably adapted to not receive tools for cutting or breaking the lock, for example, by means of the opening being sized to be about 4 inches or less tall (vertical) and about 3.5 inches or less wide (horizontal), and the opening is preferably the largest aperture through the sidewall. The housing may include a holder for an antenna mast, the holder being connected to the sidewall and pivotal from an upright position against the sidewall downward to a generally perpendicular position extending away from the sidewall, wherein the holder is latched in the upright position by a latch located inside the main body interior space that is accessible and unlatchable only inside the interior space. The lid may comprise a bar member that protrudes down into the interior space, parallel to a longitudinal axis of the mounting unit and to a central axis of the sidewall, wherein the bar member is received between stops fixed to an interior surface of the sidewall, so that the lid is not rotatable relative to the sidewall when the mounting unit is in the lowered position. The lid may be rotatable relative to the sidewall when the mounting unit is raised to move the bar member above said stops. The sidewall may comprise a circumferential rim system on an interior surface of the sidewall and said generally horizontal frame portion of the mounting unit is supported by said rim system when the mounting unit is lifted to said raised position. Said generally horizontal frame portion may comprise multiple horizontally-extending arms, and outermost ends of said arms may be supported by said rim system when the mounting unit is lifted to said raised position. The floor may comprise apertures for receiving electrical wiring from equipment housed on said mounting unit so that said wiring extends into the bottom portion of the interior space underneath the floor. A locking tab may extend down from the mounting unit, through the floor, and to the bottom portion of the interior space beneath said floor, wherein the lock may extend through a bottommost end of the locking tab beneath the floor to retain the bottommost end in said bottom portion of the interior space. The generally horizontal frame portion may be is spaced from the floor when the mounting unit is in the lowered position for receiving equipment, in a lower equipment space between the generally horizontal frame portion and the floor, that is not carried and lifted by the mounting unit when the mounting unit is slid to the raised position. Batteries may be provided in said lower equipment space, for example. The housing may be connected to a platform beneath the housing, by means of a plurality of fasteners extending from the floor and through said bottom space to said platform. In certain embodiments, there are no fasteners outside of the housing main body sidewall for connecting the housing to the platform. In certain embodiments, the lid is threadably connected to the generally vertical frame portion. In certain embodiments, the lid comprises a lid space and an antenna inside the lid space.

Certain other embodiments may be described as: A temper-resistant housing for equipment comprising:
a main body comprising having an interior space, the main body comprising a generally vertical sidewall having a bottom end and a top end, and a generally horizontal floor inside the interior space between the bottom end and the top end;
a mounting unit sliding inside the main body from a lowered position, wherein the mounting unit is substantially inside the main body, to a raised position wherein the mounting unit is substantially above the main body, the mounting unit having a lid, a generally vertical frame portion depending form the lid, and a generally horizontal frame portion at or near a bottom end of the generally vertical frame portion, wherein the mounting unit comprises an upper equipment space between the lid and the generally horizontal frame portion for receiving equipment being housed in the housing;
a lock connecting the mounting unit to the main body and located inside the interior space of the main body; and
a holder for an antenna mast, the holder being connected to the sidewall and pivotal from an upright position against the sidewall downward to a generally perpendicular position extending away from the sidewall, wherein the holder is latched in the upright position by a latch located inside the main body interior space that is accessible and unlatchable only inside the interior space.

Although this disclosed technology has been described above with reference to particular means, materials and embodiments, it is to be understood that the disclosed technology is not limited to these disclosed particulars, but extends instead to all equivalents within the broad scope of the following claims.

The invention claimed is:

1. A temper-resistant housing for equipment comprising:
a main body having an interior space, the main body comprising a generally vertical sidewall having a bottom end and a top end, and a generally horizontal floor inside the interior space between the bottom end and the top end;
a mounting unit sliding inside the main body from a lowered position, wherein the mounting unit is substantially inside the main body, to a raised position wherein the mounting unit is substantially above the main body, the mounting unit having a lid, a generally vertical frame portion depending from the lid, and a generally horizontal frame portion at or near a bottom end of the generally vertical frame portion, wherein the mounting unit comprises an upper equipment space between the lid and the generally horizontal frame portion for receiving equipment being housed in the housing;
a lock connecting the mounting unit to the main body and located inside a bottom portion of the interior space beneath said floor;

wherein the sidewall of the main body further comprises an opening through the sidewall into said bottom portion of the interior space for access to the lock.

2. The housing as in claim 1, wherein said opening is adapted to not receive tools for cutting or breaking the lock, by means of the opening being sized to be about 4 inches or less tall (vertical) and about 3.5 inches or less wide (horizontal).

3. The housing as in claim 2, wherein said opening is the largest aperture through the sidewall.

4. The housing as in claim 1, further comprising a holder for an antenna mast, the holder being connected to the sidewall and pivotal from an upright position against the sidewall downward to a generally perpendicular position extending away from the sidewall, wherein the holder is latched in the upright position by a latch located inside the main body interior space that is accessible and unlatchable only inside the interior space.

5. The housing as in claim 1, wherein the lid comprises a bar member that protrudes down into the interior space, parallel to a longitudinal axis of the mounting unit and to a central axis of the sidewall, wherein the bar member is received between stops fixed to an interior surface of the sidewall, so that the lid is not rotatable relative to the sidewall when the mounting unit is in the lowered position.

6. The housing as in claim 1, wherein the lid is rotatable relative to the sidewall when the mounting unit is raised to move the bar member above said stops.

7. The housing as in claim 1, wherein the sidewall comprises a circumferential rim system on an interior surface of the sidewall and said generally horizontal frame portion of the mounting unit is supported by said rim system when the mounting unit is lifted to said raised position.

8. The housing as in claim 7, wherein said generally horizontal frame portion comprises multiple horizontally-extending arms, and outermost ends of said arms are supported by said rim system when the mounting unit is lifted to said raised position.

9. The housing as in claim 1, wherein the floor comprises apertures for receiving electrical wiring from equipment housed on said mounting unit so that said wiring extends into the bottom portion of the interior space underneath the floor.

10. The housing as in claim 1, wherein a locking tab extends down from the mounting unit, through the floor, and to the bottom portion of the interior space beneath said floor, wherein the lock extends through a bottommost end of the locking tab beneath the floor to retain the bottommost end in said bottom portion of the interior space.

11. The housing as in claim 1, wherein the generally horizontal frame portion is spaced from the floor when the mounting unit is in the lowered position for receiving equipment, in a lower equipment space between the generally horizontal frame portion and the floor, that is not carried and lifted by the mounting unit when the mounting unit is slid to the raised position.

12. The housing as in claim 11, wherein batteries are provided in said lower equipment space.

13. The housing as in claim 1 that is connected to a platform beneath the housing, by means of a plurality of fasteners extending from the floor and through said bottom space to said platform.

14. The housing as in claim 13, wherein there are no fasteners outside of the housing main body sidewall for connecting the housing to the platform.

15. The housing as in claim 1, wherein the lid is threadably connected to the generally vertical frame portion.

16. The housing as in claim 1, wherein the lid comprises a lid space and an antenna inside the lid space.

17. A temper-resistant housing for equipment comprising:
a main body having an interior space, the main body comprising a generally vertical sidewall having a bottom end and a top end, and a generally horizontal floor inside the interior space between the bottom end and the top end;
a mounting unit sliding inside the main body from a lowered position, wherein the mounting unit is substantially inside the main body, to a raised position wherein the mounting unit is substantially above the main body, the mounting unit having a lid, a generally vertical frame portion depending from the lid, and a generally horizontal frame portion at or near a bottom end of the generally vertical frame portion, wherein the mounting unit comprises an upper equipment space between the lid and the generally horizontal frame portion for receiving equipment being housed in the housing;
a lock connecting the mounting unit to the main body and located inside the interior space of the main body; and
a holder for an antenna mast, the holder being connected to the sidewall and pivotal from an upright position against the sidewall downward to a generally perpendicular position extending away from the sidewall, wherein the holder is latched in the upright position by a latch located inside the main body interior space that is accessible and unlatchable only inside the interior space.

* * * * *